United States Patent
Hung et al.

(10) Patent No.: US 11,107,690 B2
(45) Date of Patent: Aug. 31, 2021

(54) FIN FIELD-EFFECT TRANSISTOR DEVICE AND METHOD OF FORMING THE SAME

(71) Applicant: Taiwan Semiconductor Manufacturing Company, Ltd., Hsinchu (TW)

(72) Inventors: Min-Hsiu Hung, Tainan (TW); Chien Chang, Hsinchu (TW); Yi-Hsiang Chao, New Taipei (TW); Hung-Yi Huang, Hsinchu (TW); Chih-Wei Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/265,747

(22) Filed: Feb. 1, 2019

(65) Prior Publication Data
US 2020/0176260 A1 Jun. 4, 2020

Related U.S. Application Data

(60) Provisional application No. 62/773,938, filed on Nov. 30, 2018.

(51) Int. Cl.
*H01L 21/285* (2006.01)
*H01L 21/768* (2006.01)
(Continued)

(52) U.S. Cl.
CPC .. *H01L 21/28518* (2013.01); *H01L 21/02274* (2013.01); *H01L 21/28556* (2013.01);
(Continued)

(58) Field of Classification Search
CPC ..... H01L 21/285; H01L 21/768; H01L 21/02; H01L 29/66; H01L 29/78; H01L 21/76879; H01L 21/28518; H01L 21/02274; H01L 29/66545; H01L 21/28556; H01L 29/66795; H01L 21/76802;
(Continued)

(56) References Cited

U.S. PATENT DOCUMENTS 5,344,792 A * 9/1994 Sandhu ................. C23C 16/42
117/92
5,747,384 A * 5/1998 Miyamoto ........ H01L 21/28512
438/685
(Continued)

FOREIGN PATENT DOCUMENTS

KR 20180060906 A 6/2018
KR 20180069703 A 6/2018
(Continued)

*Primary Examiner* — Thanh T Nguyen
(74) *Attorney, Agent, or Firm* — Slater Matsil, LLP

(57) ABSTRACT

A method of forming a semiconductor device includes forming source/drain regions on opposing sides of a gate structure, where the gate structure is over a fin and surrounded by a first dielectric layer; forming openings in the first dielectric layer to expose the source/drain regions; selectively forming silicide regions in the openings on the source/drain regions using a plasma-enhanced chemical vapor deposition (PECVD) process; and filling the openings with an electrically conductive material.

20 Claims, 23 Drawing Sheets

(51) Int. Cl.
*H01L 29/78* (2006.01)
*H01L 21/02* (2006.01)
*H01L 29/66* (2006.01)

(52) U.S. Cl.
CPC .. *H01L 21/76802* (2013.01); *H01L 21/76879* (2013.01); *H01L 29/66545* (2013.01); *H01L 29/66795* (2013.01); *H01L 29/785* (2013.01)

(58) Field of Classification Search
CPC ......... H01L 21/76843; H01L 29/41791; H01L 29/785; H01L 21/76856; H01L 21/28562
See application file for complete search history.

(56) References Cited

U.S. PATENT DOCUMENTS

| | | |
|---|---|---|
| 8,168,538 B2 | 5/2012 | Chen et al. |
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2005/0191812 A1* | 9/2005 | Pritchard ............ H01L 29/4958 438/299 |
| 2010/0129974 A1* | 5/2010 | Futase ............ H01L 21/823835 438/303 |
| 2015/0228793 A1* | 8/2015 | Chen ................. H01L 21/76805 257/401 |
| 2017/0103948 A1* | 4/2017 | Lee .................... H01L 21/76864 |
| 2017/0278747 A1* | 9/2017 | Adusumilli ........... H01L 23/485 |
| 2018/0151683 A1 | 5/2018 | Yeo et al. |
| 2018/0174913 A1 | 6/2018 | More et al. |

FOREIGN PATENT DOCUMENTS

| | | |
|---|---|---|
| TW | I235477 B | 7/2005 |
| TW | 201042731 A | 12/2010 |

\* cited by examiner

FIN FIELD-EFFECT TRANSISTOR DEVICE AND METHOD OF FORMING THE SAME

PRIORITY CLAIM AND CROSS-REFERENCE

This application claims priority to U.S. Provisional Patent Application No. 62/773,938, filed Nov. 30, 2018, entitled "Fin Field-Effect Transistor Device and Method of Forming the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
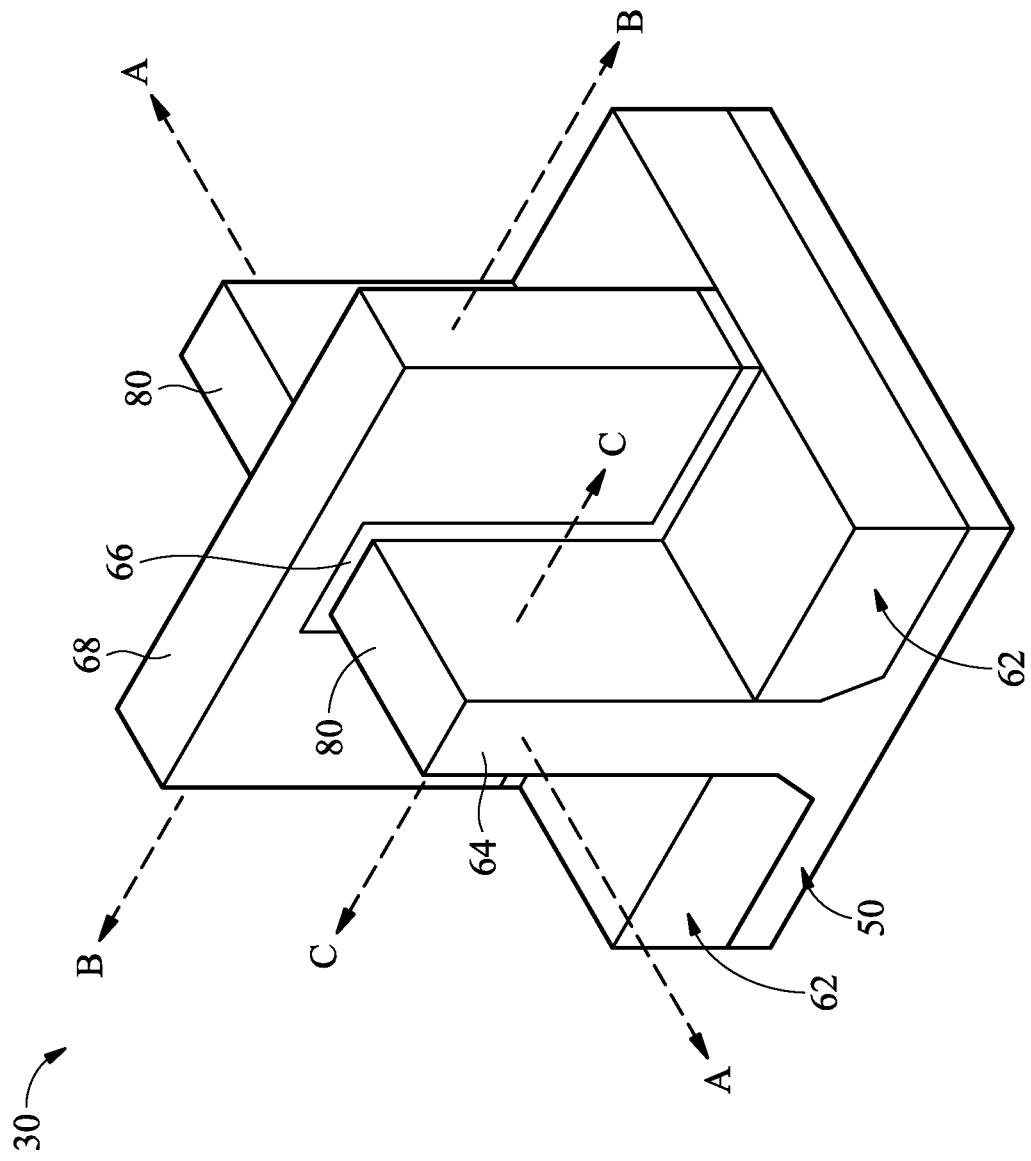
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of selectively depositing a metal layer over source/drain regions for forming silicide regions. The disclosed selective deposition method may also be used in selective deposition of a layer over different materials.

In an embodiment, an opening is formed in a dielectric layer to expose a source/drain region of a transistor. Next, a silicide layer is selectively formed in the opening on the source/drain region using a plasma enhanced chemical vapor deposition (PECVD) process, and sidewalls of the dielectric layer exposed by the opening are substantially free of the silicide layer. Since the sidewalls of the dielectric layer are substantially free of the silicide layer after the PECVD process, no etching process is needed to remove the silicide layers from the sidewalls of the dielectric layer after the silicide region is formed, which avoids performance issues related with the etching process, such as consumption and/or oxidization of the silicide region. In addition, since the sidewalls of the dielectric layer are substantially free of the silicide layer, a width of the openings (measured at the upper surface of the dielectric layer) is larger, making it easier to fill the openings with conductive materials in subsequent processing, thereby reducing or avoiding the formation of voids (e.g., empty spaces) when filling the openings. In some embodiments, the selectively formation of the silicide layer on the source/drain region is achieved by controlling the average energy of the plasmas of the PECVD process to be above a first activation energy for forming the silicide layer on the source/drain region but below a second activation energy for forming the silicide layer on the dielectric layer, which is achieved by alternately turning on and off an RF source used in the PECVD process. In addition, process conditions of the PECVD process, such as a ratio between the flow rates of precursor gases (e.g., hydrogen and titanium tetrachloride used to form the metal layer comprising titanium) used for forming the silicide layer, are controlled within a specific range (e.g., between one and two) to achieve the selective deposition of the silicide layer. Although the disclosed embodiment uses selective formation of a silicide layer over a source/drain region as an example, the principle of the disclosed method may be used to selectively forming other layer of material over surfaces of different materials.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-6, 7A-7C, 8-12, 16, 17A, and 17B are cross-sectional views of a FinFET device 100 at various stages of fabrication in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, 8-12, 16, and 17A illustrate cross-sectional views of the FinFET device 100 along cross-section A-A. FIGS. 7B and 7C illustrate embodiment cross-sectional views of the FinFET device 100 along cross-section C-C. FIG. 17B illustrates a cross-sectional view of the FinFET device 100 along cross-section B-B. Throughout the description, Figures with the same numeral but different letters (e.g., 17A, 17B) refer to different views of the same semiconductor device at a same processing step, but along different cross-sections.

Figure 2:
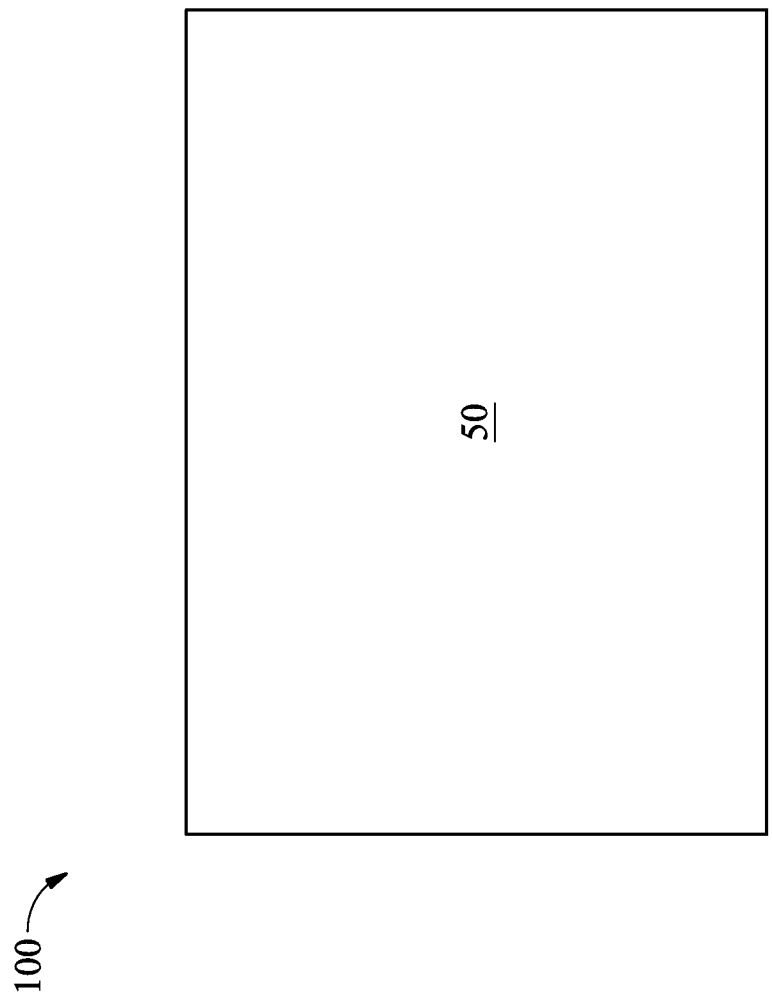
FIGS. 2-6, 7A-7C, 8-12, 16, 17A, and 17B illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
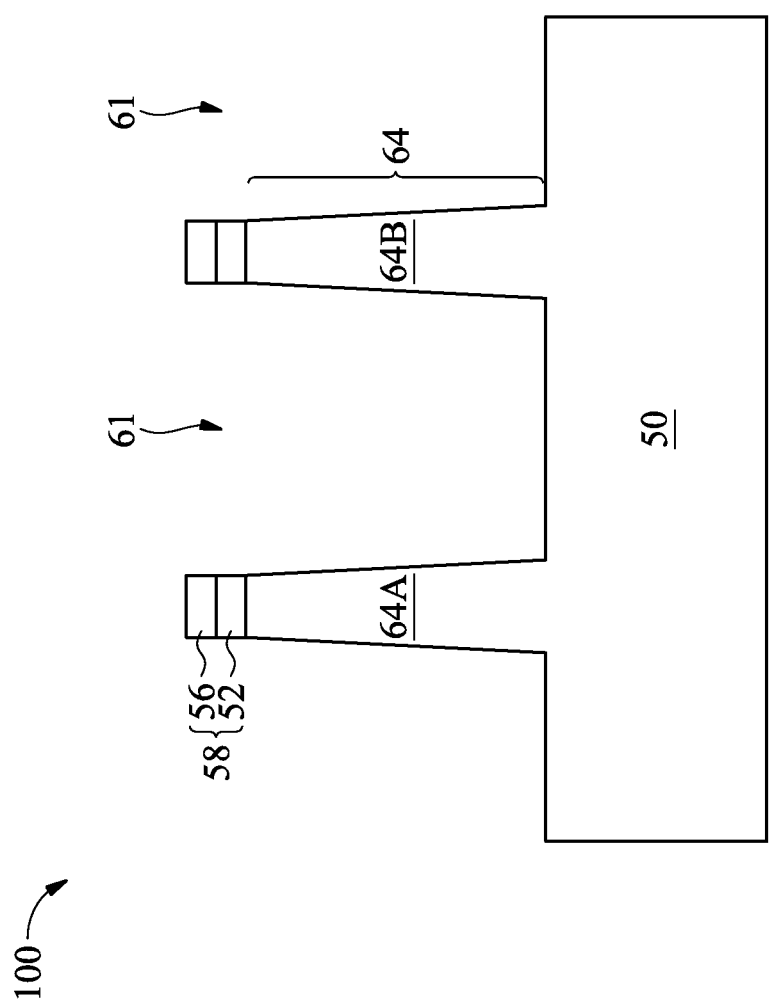

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
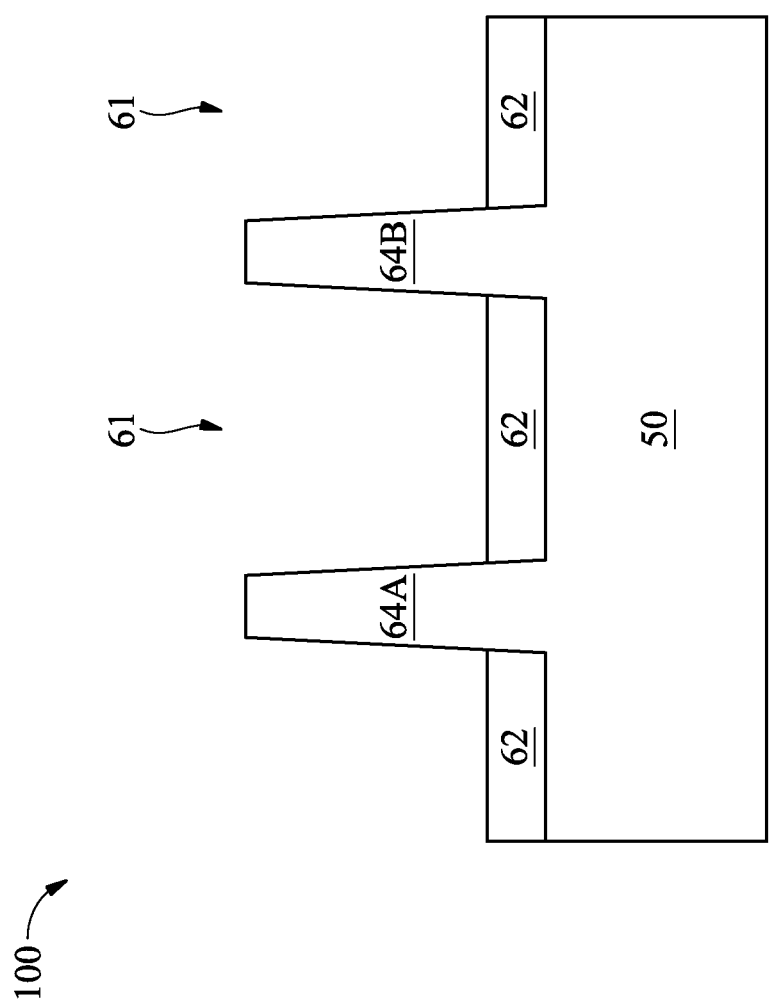

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
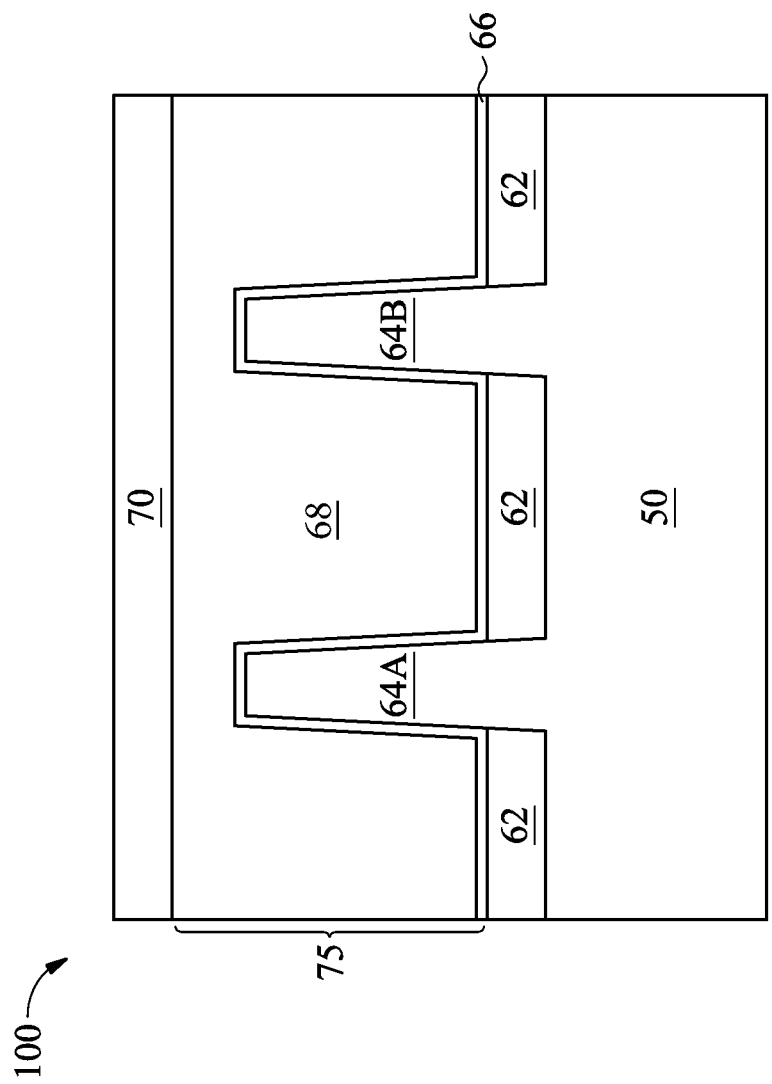

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 may then be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6, 7A, 8-12, 16, and 17A illustrate the cross-sectional views of further processing of the FinFET device 100 along cross-section A-A (along a longitudinal axis of the fin 64). Note that in FIGS. 6, 7A, 8-12, 16, and 17A, three dummy gate structures 75 (e.g., 75A, 75B, and 75C) are formed over the fin 64 as a non-limiting example. One skilled in the art will appreciate that more or less than three dummy gate structures may be formed over the fin 64, these and other variations are fully intended to be included within the scope of the present disclosure.

Figure 6:
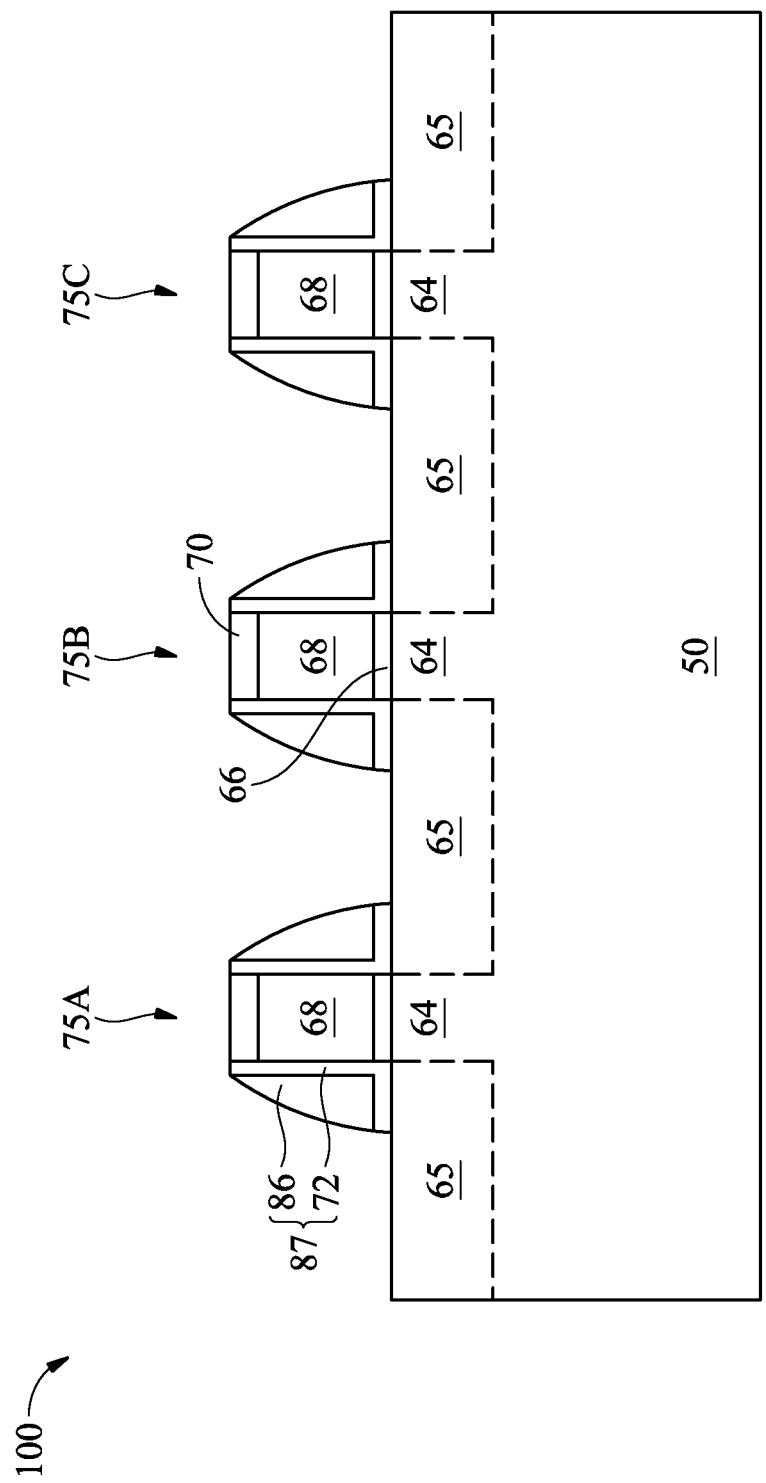

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 87 as illustrated in FIG. 6 are merely non-limiting examples, and other shapes and formation methods are possible. These and other variations are fully intended to be included within the scope of the present disclosure.

Next, as illustrated in FIG. 7, recesses are formed in the fins 64 adjacent to the dummy gate structures 75, e.g., between adjacent dummy gate structures 75 and/or next to a dummy gate structure 75, and source/drain regions 80 are formed in the recesses. The recesses are formed by, e.g., an anisotropic etching process using the dummy gate structures 75 and the gate spacers 87 as an etching mask, in some embodiments, although any other suitable etching process may also be used.

Next, the source/drain regions 80 are formed in the recesses. The source/drain regions 80 are formed by epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

Figure 7A:
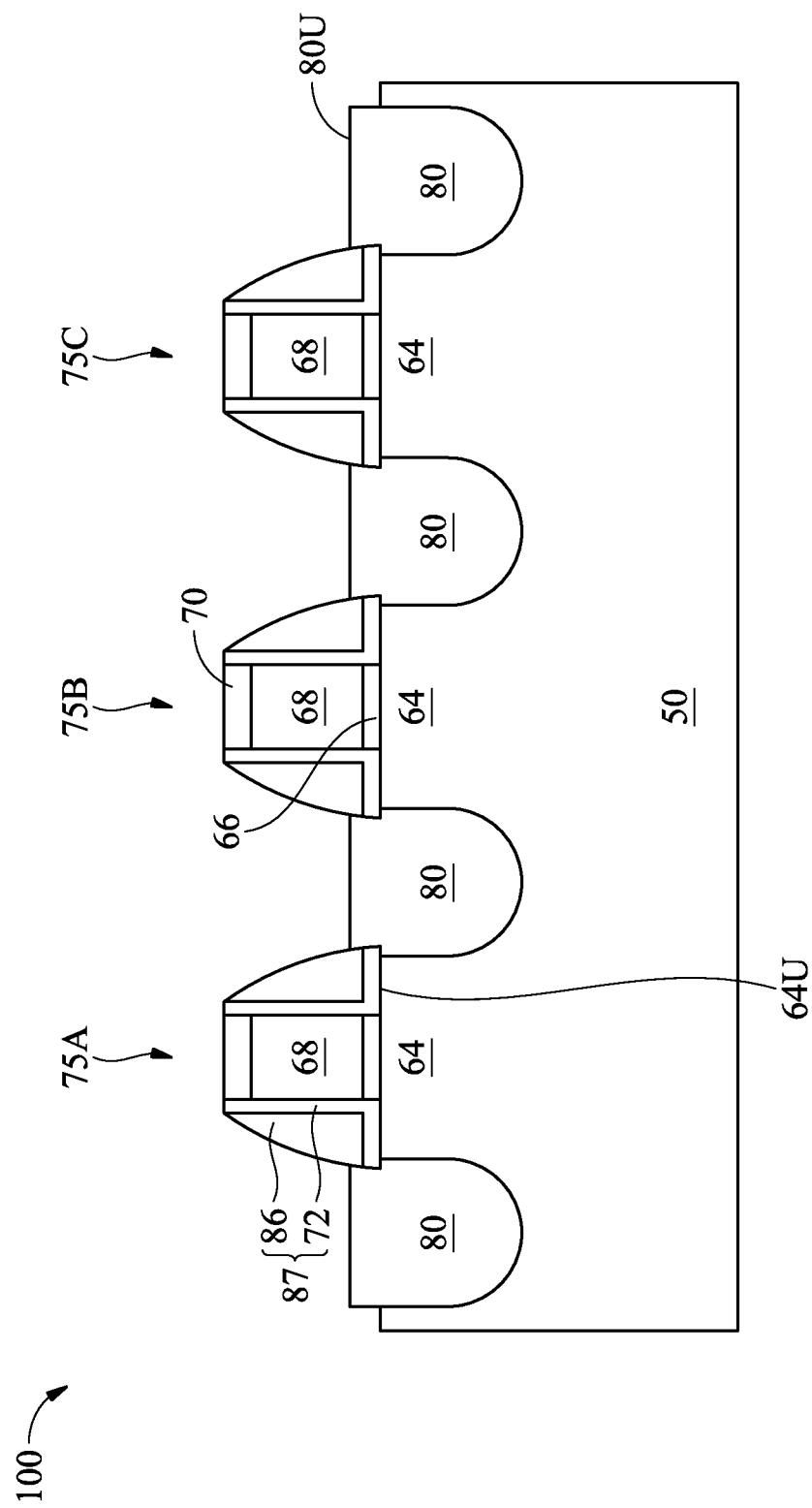
Figure 7B:
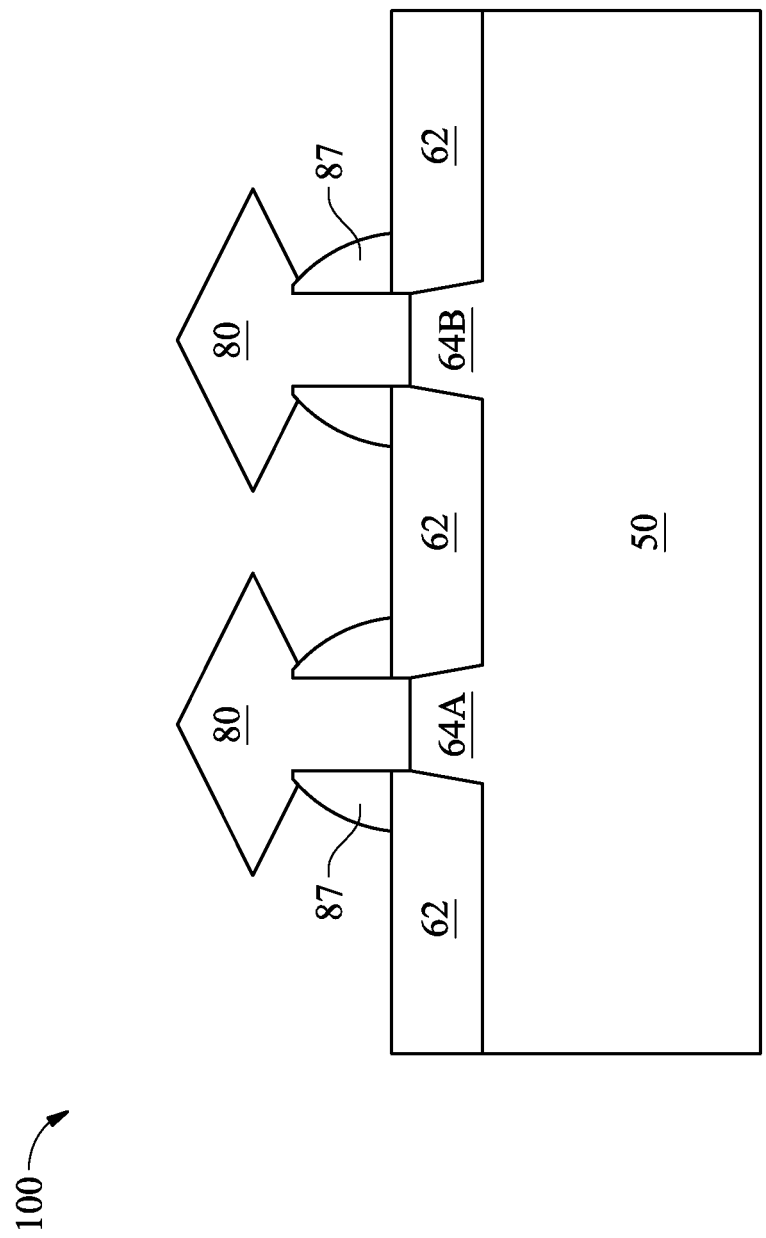
Figure 7C:
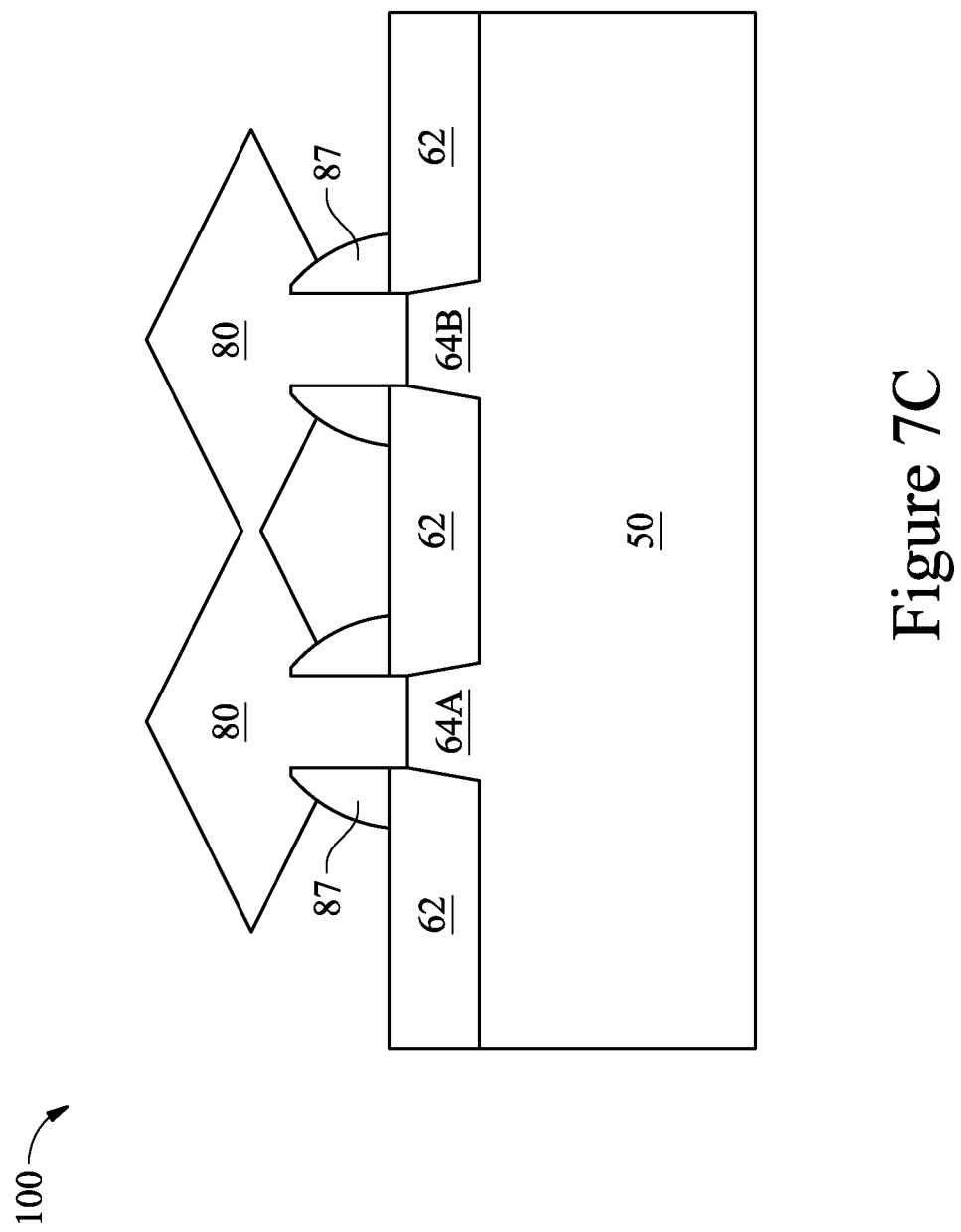

As illustrated in FIGS. 7A, 7B, and 7C, the epitaxial source/drain regions 80 may have surfaces raised from respective surfaces of the fins 64 (e.g. raised above the non-recessed portions of the fins 64) and may have facets. In the example of FIG. 7A, the upper surface 80U of the source/drain regions 80 extends above the upper surface 64U of the fin 64 by, e.g., 3 nm or more. The source/drain regions 80 of the adjacent fins 64 may merge to form a continuous epitaxial source/drain region 80 (see Figure 7C). In some embodiments, the source/drain regions 80 for adjacent fins 64 do not merge together and remain separate source/drain regions 80 (see Figure 7B). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about $1E19$ $cm^{-3}$ to about $1E21$ $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Figure 8:
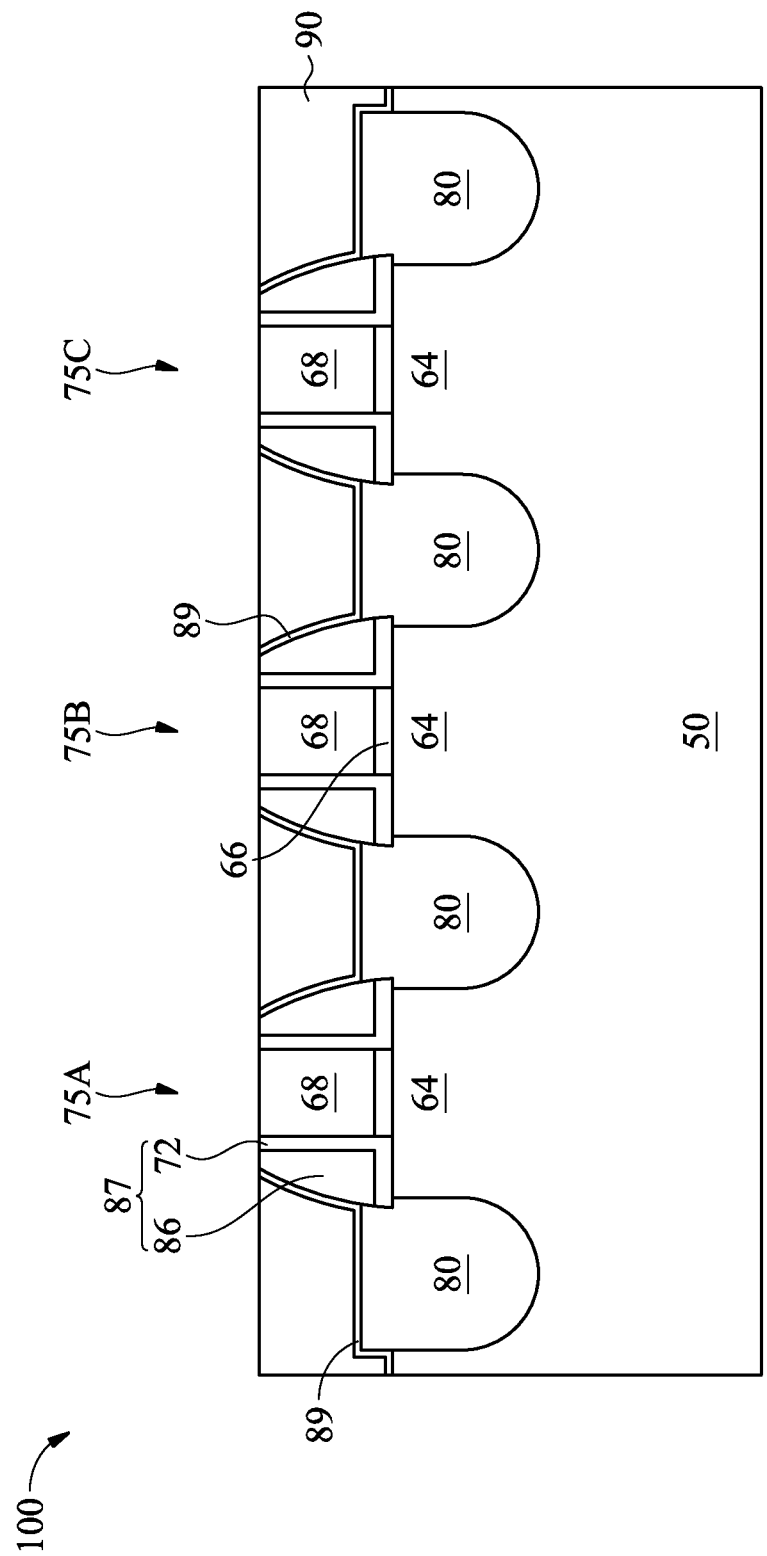

Next, as illustrated in FIG. 8, a contact etch stop layer (CESL) 89 is formed over the structure illustrated in FIG. 7A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68, as illustrated in FIG. 8.

Figure 9:
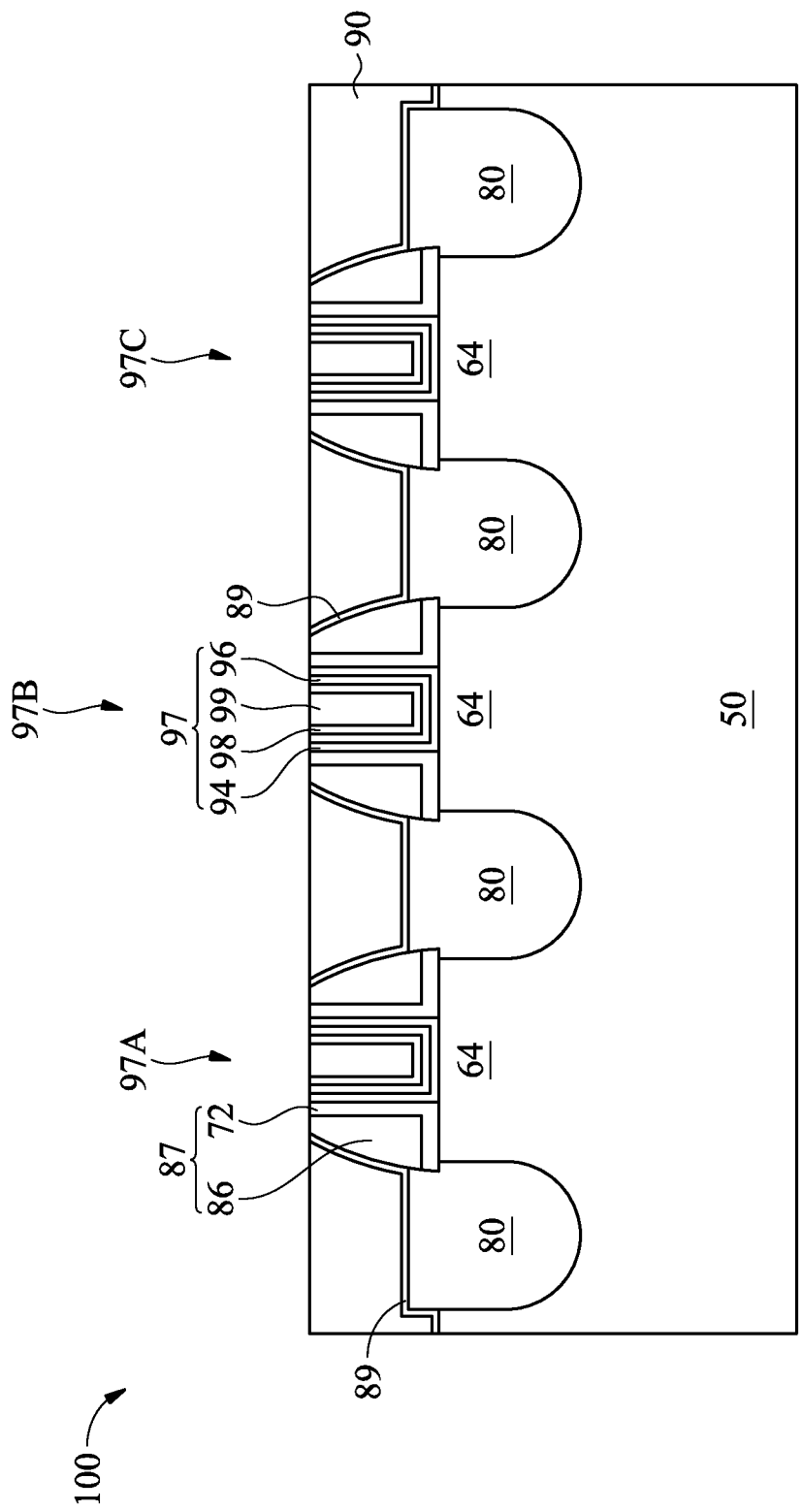

Next, in FIG. 9, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate and the active gate dielectric material(s) may be collectively referred to as a metal gate structure, or a replacement gate structure. The active gate is a metal gate, in the illustrated embodiment.

Referring to FIG. 9, the dummy gate structures 75A, 75B, and 75C (see FIG. 8) are replaced by replacement gate structures 97A, 97B, and 97C, respectively. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a seed layer 98, and a gate electrode 99 are formed in the recesses for the replacement gate structure 97. The gate dielectric layer 94 is deposited conformally in the recesses, such as on the top surfaces and the sidewalls of the fins 64, on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Although not illustrated in FIG. 9, work function layers such as P-type work function layer or N-type work function layer may be formed in the recesses over the barrier layers 96 and before the seed layer 98 is formed, in some embodiments. Exemplary P-type work function metals that may be included in the gate structures for P-type devices include TiN, TaN, Ru, Mo, Al, WN, ZrSi2, MoSi2, TaSi2, NiSi2, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, the seed layer 98 is formed conformally over the barrier layer 96. The seed layer 98 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 98 comprises a titanium layer and a copper layer over the titanium layer.

Next, the gate electrode 99 is deposited over the seed layer 98, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer (if formed), the seed layer 98, and the gate electrode 99, which excess portions are over the top surface of the first ILD 90. The resulting remaining portions of the gate dielectric layer 94, the barrier layer 96, the work function layer (if formed), the seed layer 98, and the gate electrode 99 thus form the replacement gate structure 97 of the resulting FinFET device 100.

Figure 10:
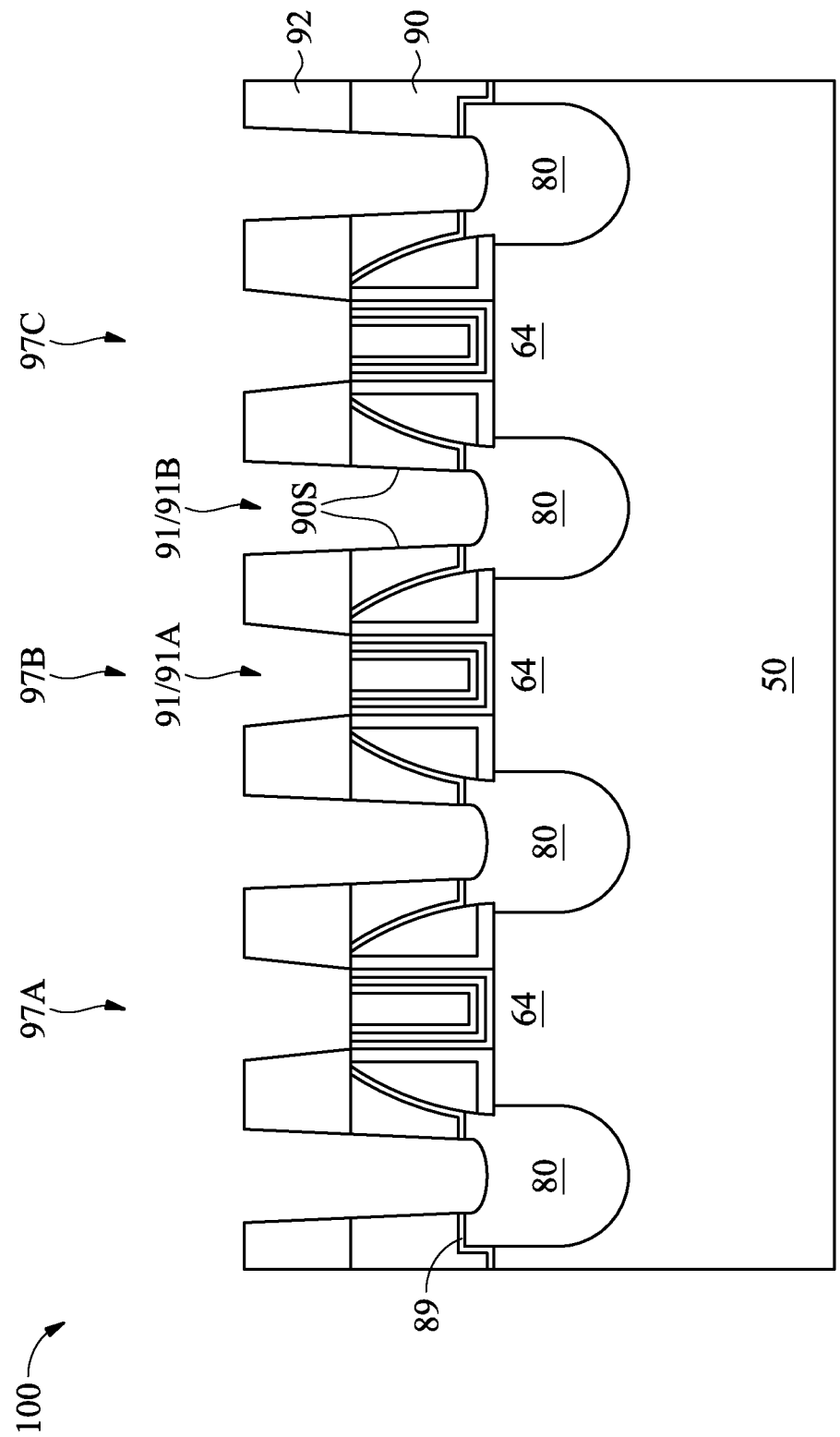

Referring next to FIG. 10, a second ILD 92 is formed over the first ILD 90. Next, contact openings 91 (e.g., 91A, 91B) are formed through the second ILD 92 to expose the replacement gate structures 97 (e.g., 97A, 97B, and 97C), or through the second ILD 92 and the first ILD 90 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. In some embodiments, the first ILD 90 and the second ILD 92 are formed of a same material (e.g., silicon oxide).

The contact openings 91 may be formed using photolithography and etching. The etching process etches through the CESL 89 to expose the source/drain regions 80. The etching process may expose the replacement gate structures 97. In the example of FIG. 10, the etching process to form the contact openings 91 also removes top portions of the source/drain regions 80, and in addition, bottom portions of the contact openings 91 may extend laterally beyond sidewalls 90S of the first ILD 90.

Figure 11:
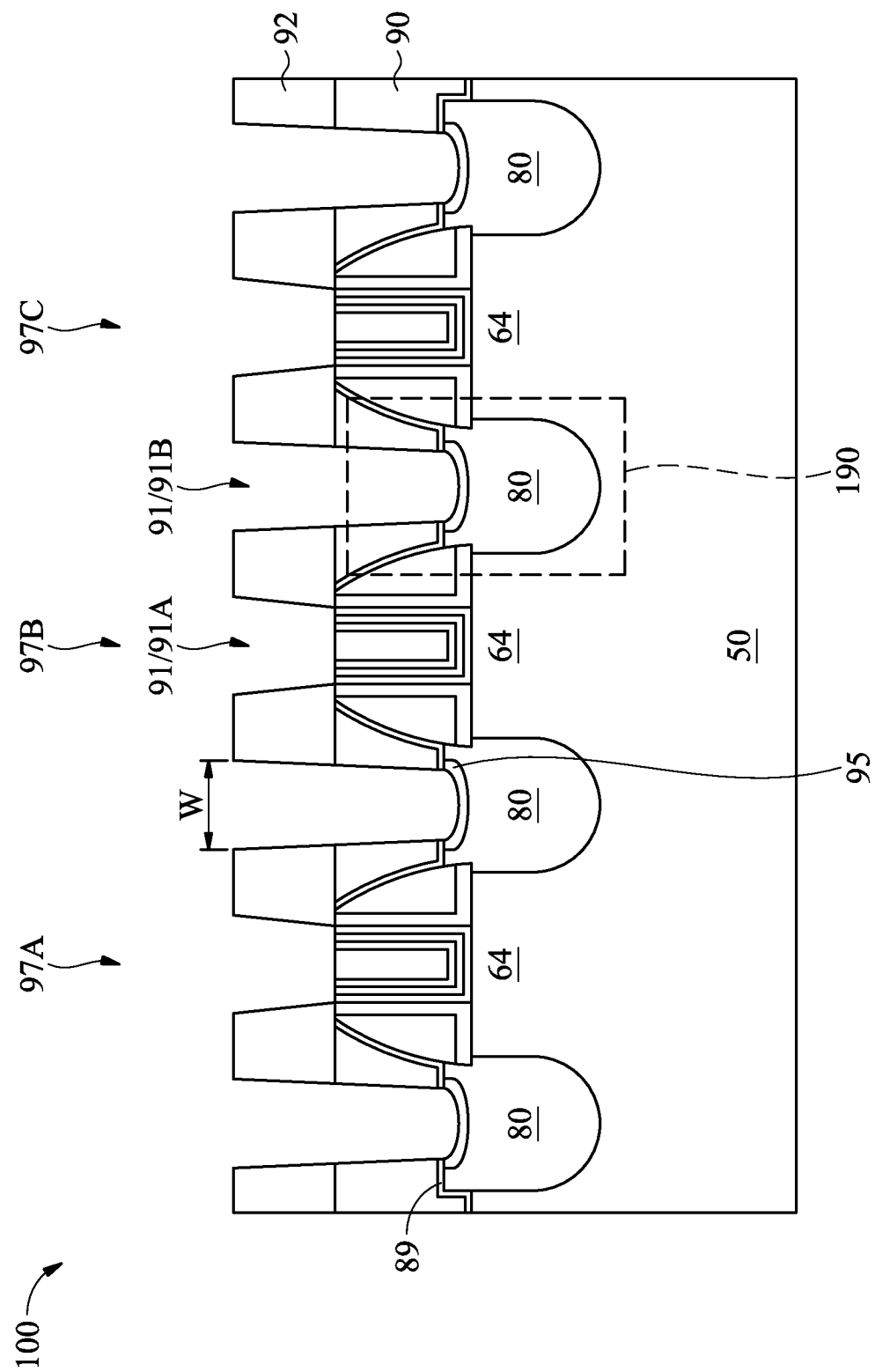

Next, in FIG. 11, a layer 95 is selectively formed (e.g., deposited) on the source/drain regions 80 exposed by the contact openings 91B (also referred to as source/drain contact openings). In the illustrated embodiment, the layer 95 is a layer of silicide over the source/drain regions 80, and therefore, the layer 95 may also be referred to as silicide regions 95. The layer 95 comprises a metal component capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys. In the illustrated embodiment, the layer 95 comprises titanium silicide (e.g., TiSi).

In some embodiments, to selectively form the layer 95 on the source/drain regions 80, a PECVD process is performed with the process conditions of the PECVD process tuned to achieve selective deposition of the layer 95, details of which are discussed hereinafter. In some embodiments, an RF source (also referred to as an RF power source) is used in PECVD process to active (e.g., ignite) gases into plasmas. The RF source in a conventional PECVD system, once turned on, stays on throughout the PECVD process. In the present disclosure, the PECVD process is performed using a RF source that is turned on and off alternately (instead of staying on) during the PECVD process, details of which are discussed hereinafter with reference to FIGS. 13A-13C. For example, the RF source of the PECVD deposition tool used in the present disclosure may have a control mechanism that is configured to turn the RF source on and off alternately during the PECVD process in accordance with some parameters (e.g., ON-time, OFF-time, discussed hereinafter) that are controllable or programmable.

In the illustrated embodiment, the PECVD process is performed using a gas source (e.g., precursors) comprising a hydrogen gas (e.g., $H_2$) and a titanium tetrachloride gas (e.g., $TiCl_4$). A ratio between the flow rate of the $H_2$ gas and $TiCl_4$ gas is smaller than about 2, such as between about 1 and about 2. The $H_2$ gas and $TiCl_4$ gas are activated (e.g., ignited) into plasmas by the RF source used in the PECVD process. During the PECVD process, the RF power is smaller than about 500 W, such as between about 100 W and about 500 W. The RF frequency of the RF source is between about 1 KHz and about 10 KHz, a pressure of the PECVD process is between about 1 Torr and about 10 Torr, and a temperature of the PECVD process is between about 100° C. and about 500° C., such as 400° C., in the illustrated embodiment. The chemical reaction between the precursors may be describe as:

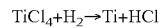

Titanium formed by the above chemical reaction reacts with the material (e.g., Si) at the surface of the source/drain regions 80 to form the silicide regions 95, details of which are discussed hereinafter.

Figure 13A:
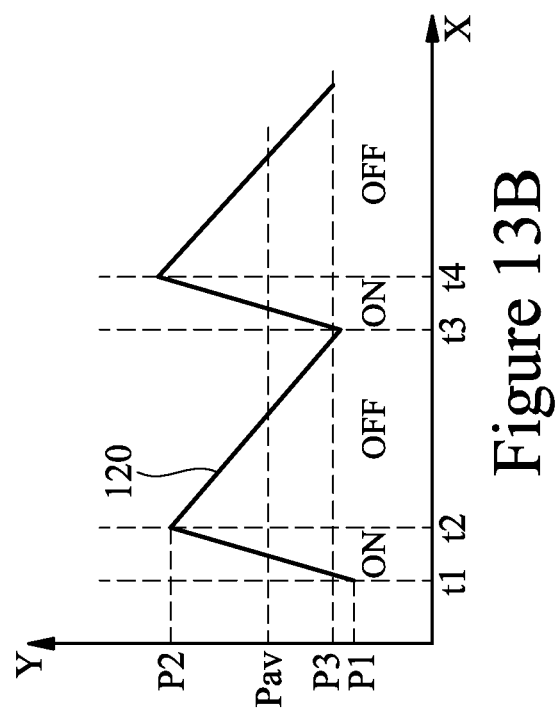
FIGS. 13A-13C illustrate energy levels of the plasmas in a plasma-enhanced chemical vapor deposition (PECVD) process, in various embodiments.
Figure 13B:
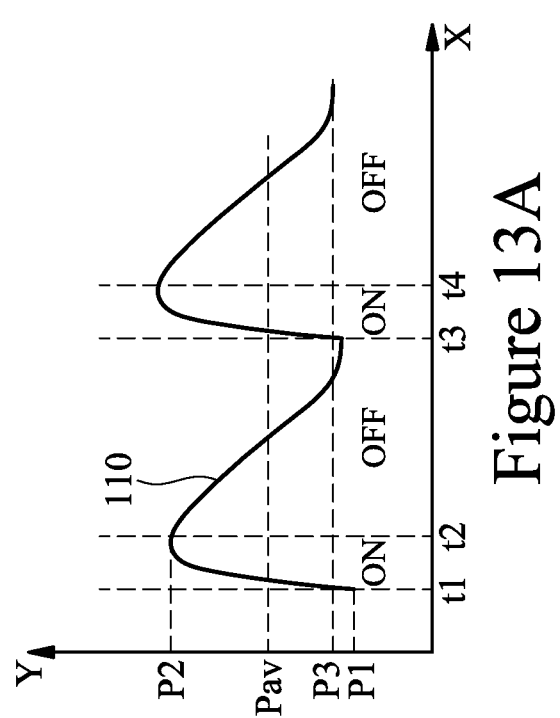
Figure 13C:
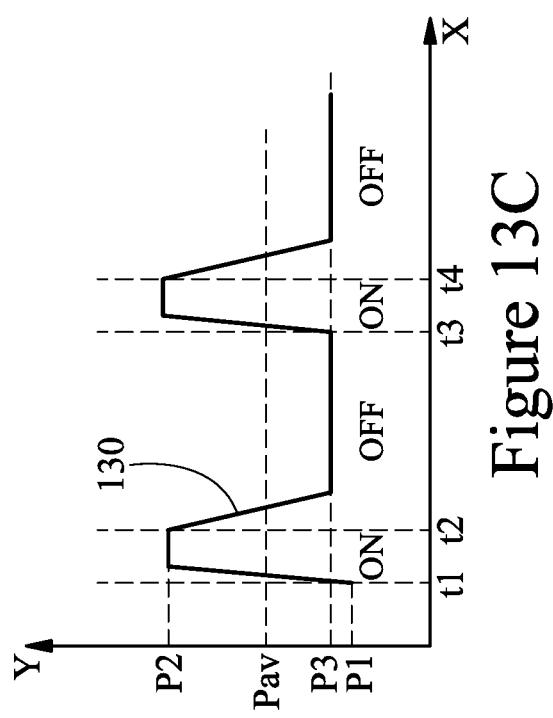

In some embodiments, the RF source of the PECVD tool is turned on and off alternately during the PECVD process to adjust the average energy of the plasmas (e.g., plasma of hydrogen and plasma of titanium tetrachloride) of the PECVD process. FIGS. 13A-13C illustrate a few examples for the energy levels of the plasmas of the PECVD process in response to the RF source being turned on and off alternately. In each of FIGS. 13A-13C, the x-axis illustrates the time of the PECVD process, and the y-axis illustrates the energy of the plasmas. For example, in FIG. 13A, the RF source is turned on at time t1 and stays on between time t1 and time t2, which causes the energy of the plasmas to increase from P1 to P2, as illustrated by the curve 110 in FIG. 13A. At time t2, the RF source is turned off and stays off between time t2 and time t3, and as a result, the energy of the plasmas drops from P2 to P3. Then, at time t3, the RF source is turned on again, and at time t4, the RF source is turned off again. The above described On-and-Off pattern for the RF source is repeated during the PECVD process until a target thickness for the layer 95 is reached. The duration between time t1 and t3 may be referred to as a cycle, or an On-Off period, of the RF source, and the RF source may be described as being turned on and off periodically. The duration between time t1 and time t2 is referred to as the ON-time in a cycle, and the duration between time t2 and time t3 is referred to as the OFF-time in a cycle.

FIG. 13A further illustrates the average energy $P_{av}$ of the plasmas of the PECVD process, which is between P2 and P1 (or P3). The shape of the curve 110 for the energy level of the plasmas shown in FIG. 13A is a non-limiting example, and other shapes for the energy level of the plasmas in the PECVD process are also possible and are fully intended to be included within the scope of the present disclosure. For example, curve 120 in FIG. 13B and curve 130 in FIG. 13C illustrate two additional examples of the average energy of the plasmas being modulated (e.g., adjusted) by the switching (turning on and off alternately) of the RF source. In particular, the curve 120 comprises triangle shapes (may also be referred to as saw-tooth shapes), and the curve 130 comprises trapezoidal shapes.

By adjusting the duration between time t1 and time t2 (the ON-time) and the duration between time t2 and time t3 (the OFF-time) in an On-Off period, the average energy $P_{av}$ of the plasmas can be easily adjusted to achieve a target level, when the RF source is operating at a fixed power level. This illustrates an advantage of the present disclosure. In a conventional PECVD system, the RF source stays on during the PECVD process, and therefore, may result in a substantially fixed energy level for the plasmas of the PECVD process. In addition, even with an adjustable RF power for the RF source, it may still be difficult for the conventional PECVD system to easily adjust the average energy of the plasmas, or to accurately achieve a low and stable average energy for the plasmas. The current PECVD system, with the RF source being switched on and off periodically, offers an effective, easy, and accurate way to adjust the average energy of the plasmas of the PECVD process over a wide range. This may be achieved, e.g., by adjusting the ON-time and the OFF-time in an On-Off period of the RF source.

In an illustrative embodiment, the duration between time t1 and t2 is about 10 μs, and the duration between time t2 and time t3 is about 50 μs. In other words, in each On-Off period, the RF source stays on (e.g., operates) for about 10 μs, and then stays off (e.g., not operating) for about 50 μs. The above values for the ON-time and OFF-time are merely non-limiting examples. Other durations for the ON-time and OFF-time are also possible and are fully intended to be included within the scope of the present disclosure.

In some embodiments, to achieve selectively deposition of the layer 95 on the source/drain regions 80, the average energy of the plasmas of the PECVD process is adjusted (e.g., by tuning the ON-time and the OFF-time of a cycle) to be above a first activation energy for forming the layer 95 on the source/drain regions 80 but below a second activation energy for forming the layer 95 on, e.g., the first ILD 90.

Figure 14:
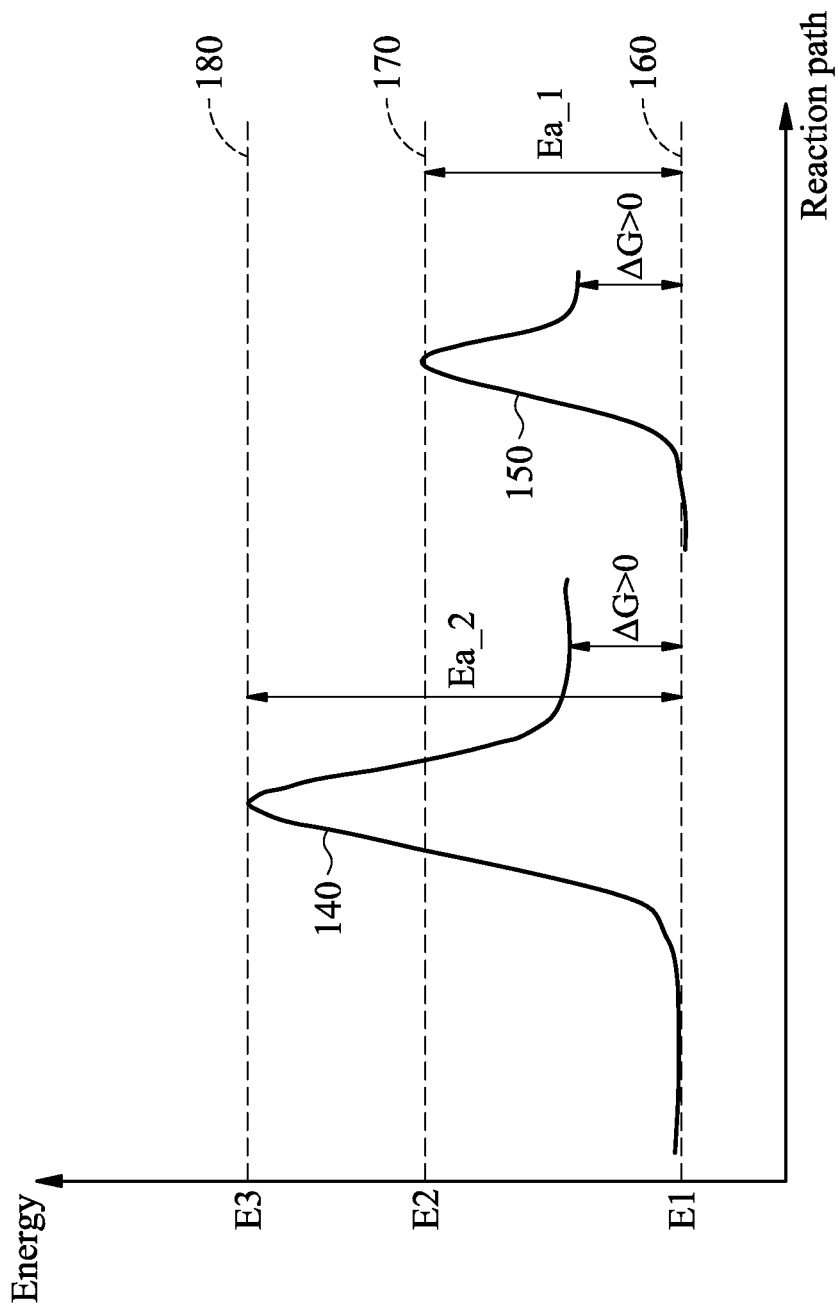
FIG. 14 illustrates activation energies for the deposition of a layer over different types of materials, in an embodiment.

Referring now to FIG. 14, curve 150 illustrates the energy needed for the formation of the layer 95 on the exposed surfaces of the source/drain regions 80, and curve 140 illustrates the energy needed for the formation of the layer 95 on the surfaces of the first ILD 90. For example, curve 150 shows that an activation energy $E_{a\_1}$ equal to the difference between energy level E2 and E1 (e.g., $E_{a\_1}$=E2-E1) is needed to break, e.g., Si—Si bonds at the exposed surfaces of the source/drain regions 80 (e.g., Si), and to allow the metal components of the layer 95 (e.g., Ti) to form bonds (e.g., Ti—Si bonds) with the exposed surfaces of the source/drain regions 80. Therefore, the activation energy $E_{a\_1}$ represents the Si—Si bond dissociation energy (e.g., about 310 KJ/mol), in some embodiments. Similarly, curve 140 shows that an activation energy $E_{a\_2}$ equal to the difference between energy level E3 and E1 (e.g., $E_{a\_2}$=E3-E1) is needed to break, e.g., Si—N bonds at the surfaces of the first ILD 90, and to allow the metal component (e.g., Ti) of the layer 95 to form bonds with the surfaces of the first ILD 90. Therefore, the activation energy $E_{a\_2}$ represents the Si—N bond dissociation energy (e.g., about 437 KJ/mol), in some embodiments. Since $E_{a\_2}$ is larger than $E_{a\_1}$, selective deposition of the layer 95 is achievable if the energy provided by the plasmas of the PECVD process falls between $E_{a\_1}$ and $E_{a\_2}$. In other words, if the energy provided by the plasmas of the PECVD process is larger than the activation energy $E_a$ but smaller than the activation energy $E_{a\_2}$, the layer 95 is formed on the source/drain regions 80 but not formed on the first ILD 90. FIG. 14 further illustrates the Gibbs free energy ΔG for the illustrated deposition processes. In the example of FIG. 14, the Gibbs free energy ΔG is larger than zero, which indicates that energy is needed to kick-off the reaction. (e.g., ΔG>0).

Figure 15:
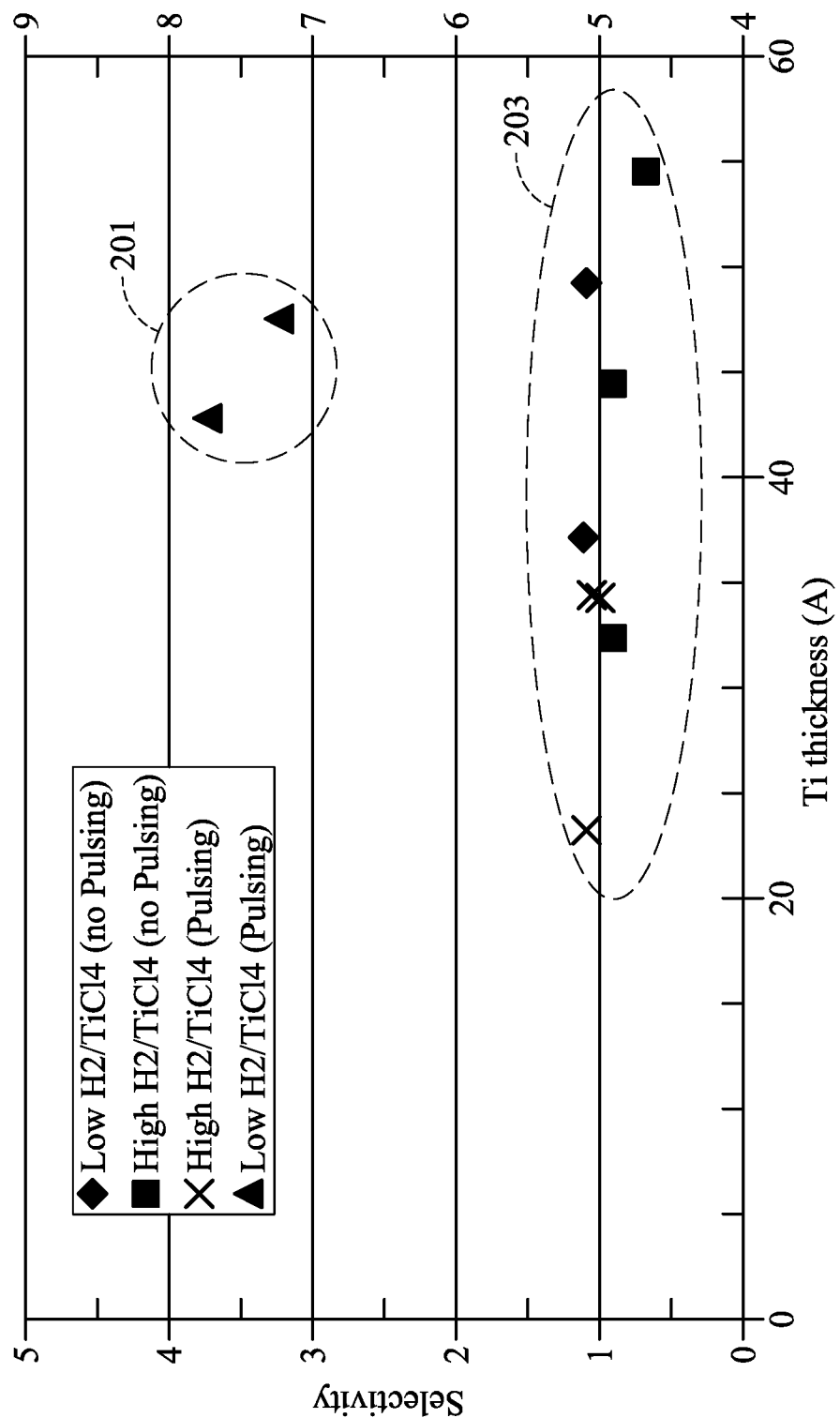
FIG. 15 illustrates the deposition selectivity of various PECVD processes with different process conditions, in some embodiments.

As mentioned above, the process conditions of the disclosed PECVD process are tuned to achieve selective deposition of the layer 95. Besides adjusting the ON-time and the OFF-time in each cycle of RF source, other process conditions, such as the ratio between the flow rate of $H_2$ and the flow rate of $TiCl_4$ (may also be referred to as flow rate ratio for ease of discussion), is also controlled to be within a target range to achieve selective deposition of the layer 95. To illustrate the importance of process conditions for selective deposition of the layer 95, FIG. 15 shows the selectivity of PECVD deposition process under different process conditions. In FIG. 15, the y-axis illustrates the selectivity of the deposition process, which selectivity may be calculated as a ratio between the thickness of the deposited layer (e.g., TiSi) on the source/drain regions 80 and the thickness of the deposited layer on the first ILD 90. The x-axis illustrates the thickness of the deposited layer (e.g., TiSi) formed on the source/drain regions 80 for different sets of experiment data. Experiment data for four different combinations of process conditions, namely low flow rate ratio with RF source pulsing, low flow rate ratio without RF source pulsing, high flow rate ratio with RF source pulsing, and high flow rate ratio without RF source pulsing, are plotted in FIG. 15, where RF source with pulsing means that the RF source is turned on and off alternately (see, e.g., FIG. 13A-13C)

during the PECVD process, low flow rate ratio refers to a flow rate ratio between $H_2$ and $TiCl_4$ smaller than 2, and high flow rate ratio refers to a flow rate ratio between $H_2$ and $TiCl_4$ larger than 2. For data inside area 203, values for the selectivity are shown on the y-axis on the left side of FIG. 15. For data inside area 201, the values for the selectivity are shown on the y-axis on the right side of FIG. 15.

From FIG. 15, it is seen that when the ratio between the flow rate of $H_2$ and the flow rate of $TiCl_4$ is larger than 2 (e.g., high flow rate ratio), the selectivity of the deposition process is low (e.g., with a value around 1), regardless of whether the RF source is pulsing (turned on and off alternately) or not. In other words, a low flow rate ratio (e.g., a ratio between the flow rate of $H_2$ and the flow rate of $TiCl_4$ smaller than 2) is a necessary condition for selectively deposition of TiSi on the source/drain regions 80, in the illustrated embodiment. In addition, FIG. 15 shows that having a low flow rate ratio is not a sufficient condition for selectively deposition of TiSi on the source/drain regions 80, as indicated by the low selectivity for the process condition of "low flow rate ratio without RF source pulsing" (labeled as "Low H2/TiCl4 (no Pulsing)" in FIG. 15). In other words, selectively deposition of TiSi on the source/drain regions 80 is possible only when a low flow rate ratio is combined with RF source pulsing as the process conditions, in the illustrated embodiment.

Referring back to FIG. 11, a first activation energy for forming the layer 95 on the source/drain regions 80 is smaller than a second activation energy for forming the layer 95 on the first ILD 90, and therefore, by controlling the average energy of the plasmas of the PECVD process to be above the first activation energy but below the second activation energy, the metal (e.g., Ti formed by the chemical reaction between the precursors) can form bonds with the source/drain regions 80 to form the layer 95 but could not form bonds with the first ILD 90. As a result, the layer 95 (e.g., TiSi) is formed on the source/drain regions 80, but not on the first ILD 90. Similarly, by controlling the average energy of the plasmas of the PECVD process to be above the first activation energy but below the activation energies needed for forming the layer 95 on the second ILD 92 and on the metal gate structures 97, the layer 95 (e.g., TiSi) is formed on the source/drain regions 80 but not formed on the second ILD 92 or the metal gate structures 97. Therefore, sidewalls of the first ILD 90 that are disposed above an upper (e.g., uppermost) surface of the selectively formed layer 95 is substantially free of the layer 95.

Figure 12:
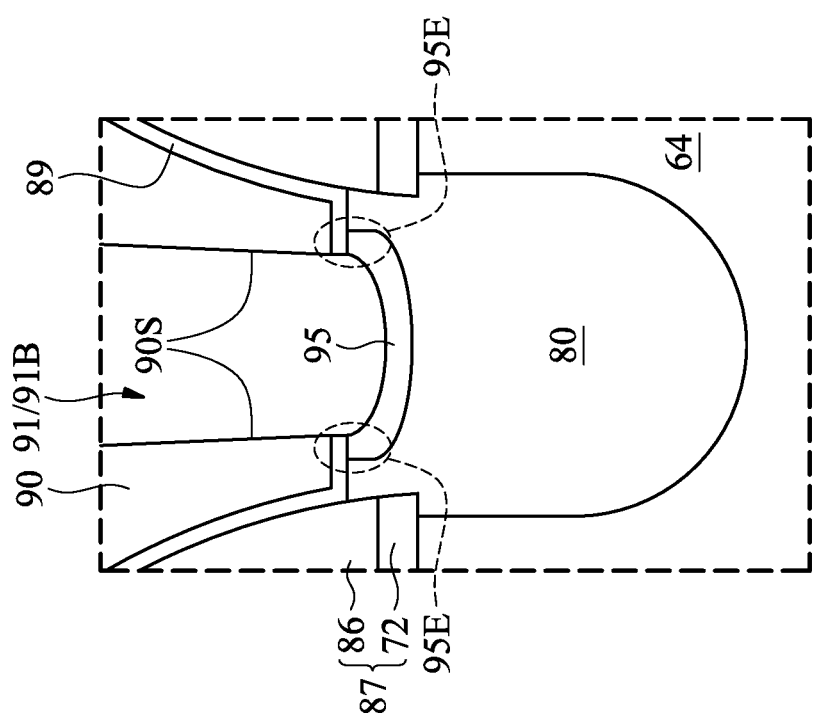

FIG. 12 is a zoomed-in view of an area 190 of FIG. 11. FIG. 12 shows that due to the disclosed PECVD process used to form the layer 95, the layer 95 has end portions 95E (portions inside the dashed circles) that extend beyond sidewalls 90S of the first ILD 90. In other words, the end portions 95E are disposed under the first ILD 90 and under bottom portions of the CESL 89. These end portions 95E increase the size of the silicide regions, and as a result, improves the electrical performance (e.g., lower contact resistance) of the device formed.

Referring back to FIG. 11, after the layer 95 is formed, an optional anneal process may be performed to control the phase of the silicide regions. Note that since the layer 95 was selectively formed over the source/drain region 80, the sidewalls of the first ILD 90 and the second ILD 92 are substantially free of the layer 95. As a result, after the layer 95 are formed, there is no need to perform an etching process to remove the layer 95 from the sidewalls of the first ILD 90 and the second ILD 92. Since etching process, if performed, may oxidize the silicide regions 95 and may consume the silicide regions 95 (which degrades the electrical performance of the device by increasing the contact resistance), the current disclosure, by obviating the need to perform such an etching process, avoids the performance degradation caused by the etching process. In addition, since the sidewalls of the first ILD 90 and sidewalls of the second ILD 92 are substantially free of the layer 95, a width W of the contact openings 91 (measured at the upper surface of the second ILD 92) remain unchanged after the formation of the silicide region 95, thereby making it easier to form subsequent layers (see, e.g., 101, 103 and 105 in FIG. 17A) in the contact openings 91. Otherwise, if the sidewalls of the first ILD 90 and sidewalls of the second ILD 92 are covered by the layer 95, the width W would decrease, and the aspect ratio of the contact openings 91 would increase, making it harder to form the subsequent layers in the narrower contact openings 91, and voids (e.g., empty spaces) may form when filling the contact openings 91 with conductive materials. The voids, together with a smaller volume of conductive material in the contact openings 91, may increase the resistance of the source/drain contacts formed subsequently. In contrast, the presently disclosed methods, by selectively forming the layer 95 on the source/drain regions 80, avoids the above described issues.

Figure 16:
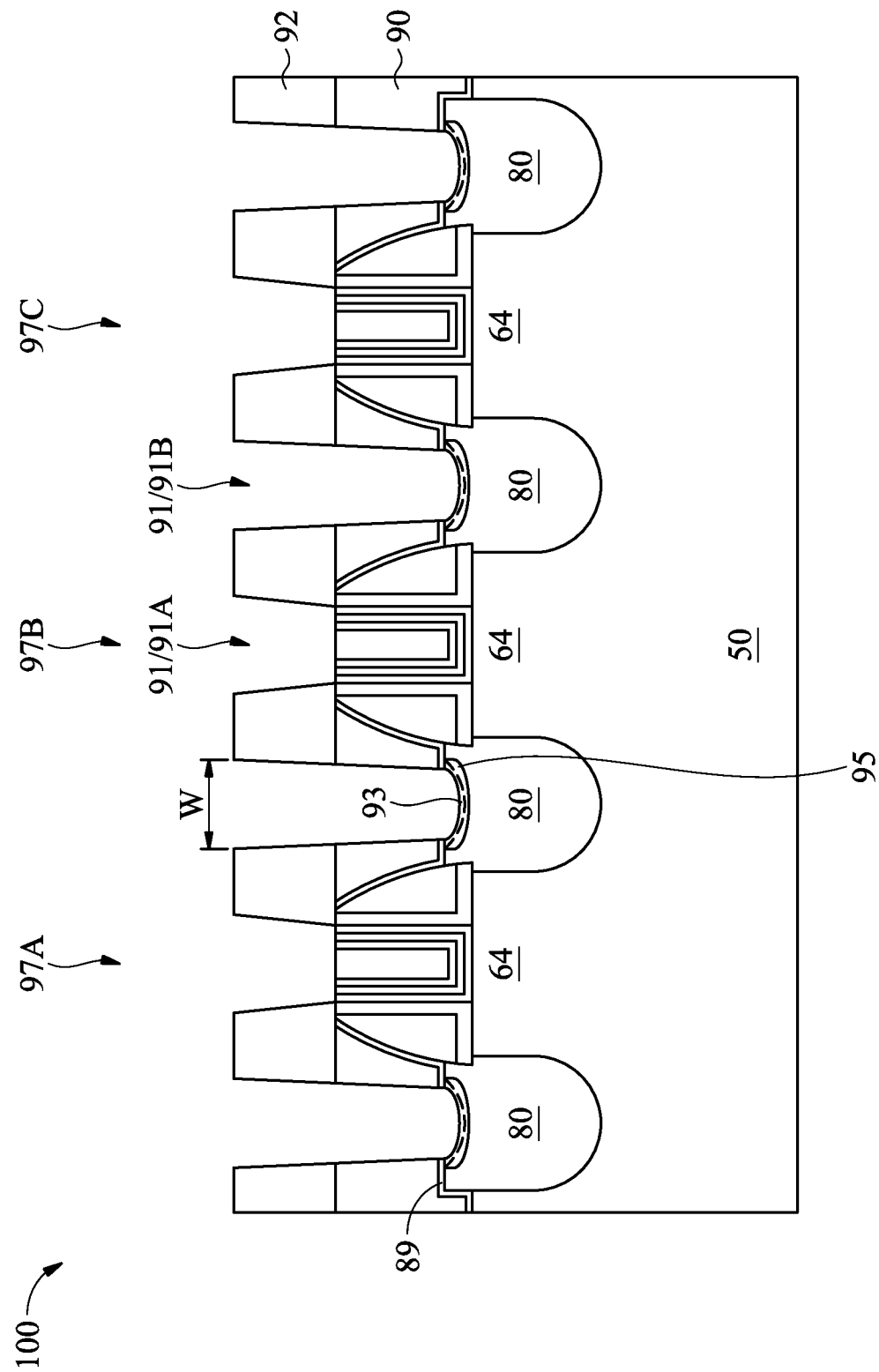

Next, in FIG. 16, an optional barrier layer 93 is formed over the silicide regions 95 to protect the silicide regions 95, e.g., from being further oxidized. In an illustrative embodiment, the barrier layer 93 is formed in a self-aligned manner by performing an oxidization process or a nitridation process to convert upper portions (e.g., portions proximate the upper surface of the silicide regions 95 in FIG. 11) of the silicide regions 95 into an oxide or a nitride. For example, a nitrogen-containing plasma and/or a nitrogen-containing gas may be supplied to be in contact with the silicide regions 95 to from a nitride (e.g., 93) of the silicide regions 95, which nitride may be or comprise titanium silicide nitride (TiSiN). Similarly, an oxygen-containing plasma and/or an oxygen-containing gas may be supplied to be in contact with the silicide regions 95 to from an oxide (e.g., 93) of the silicide regions 95, which oxide may be or comprise titanium silicide oxide (TiSiO). Since the barrier layer 93 is formed in a self-aligned manner, no mask layer or etching process is needed to form the barrier layer 93, the simple processing to form the barrier layer 93 is another advantage of the present disclosure. In other embodiments, the barrier layer 93 is not formed. For simplicity, subsequent figures do not show the barrier layer 93, with the understanding that the barrier layer 93 may be formed.

Figure 17A:
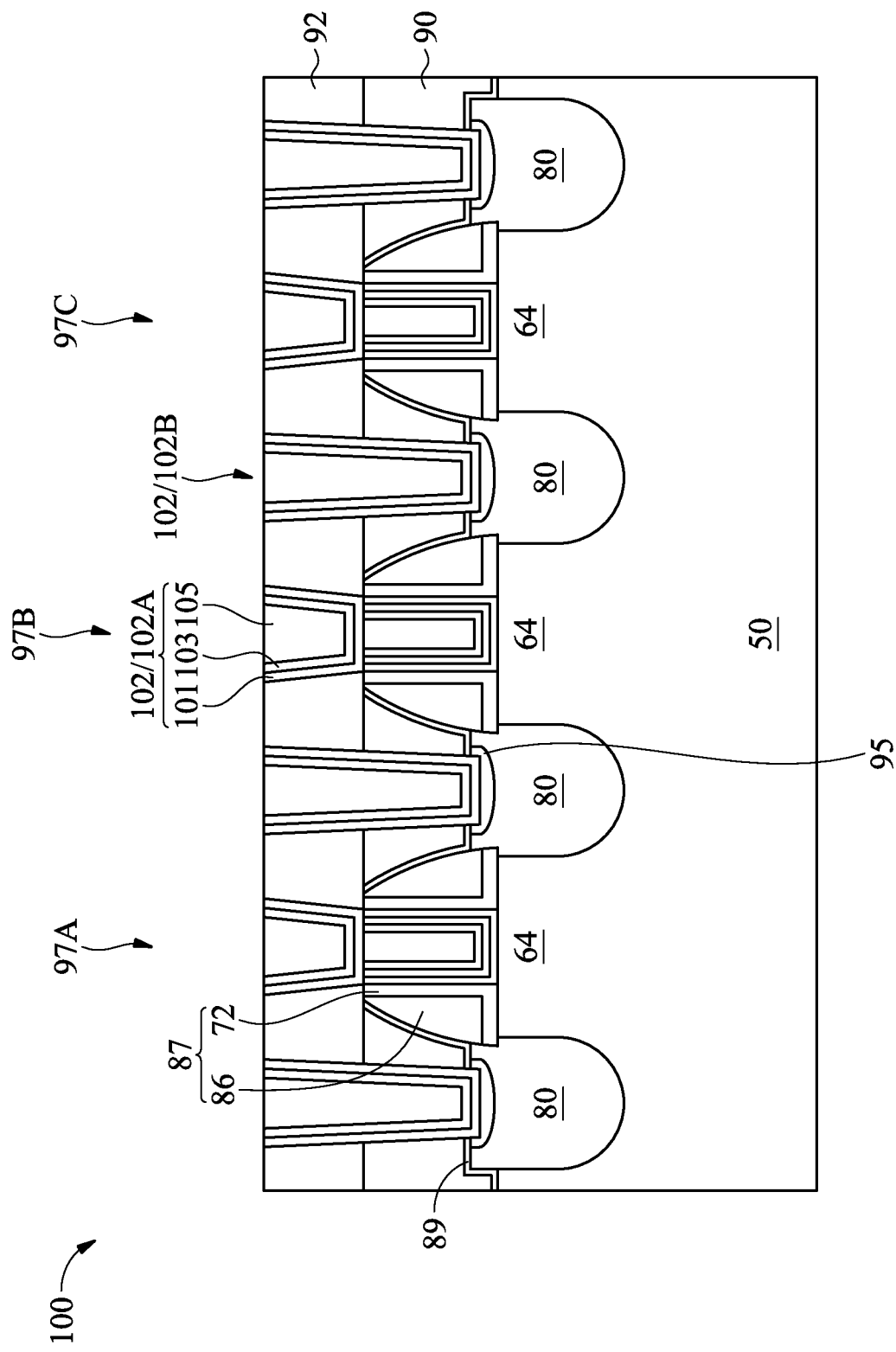
Figure 17B:
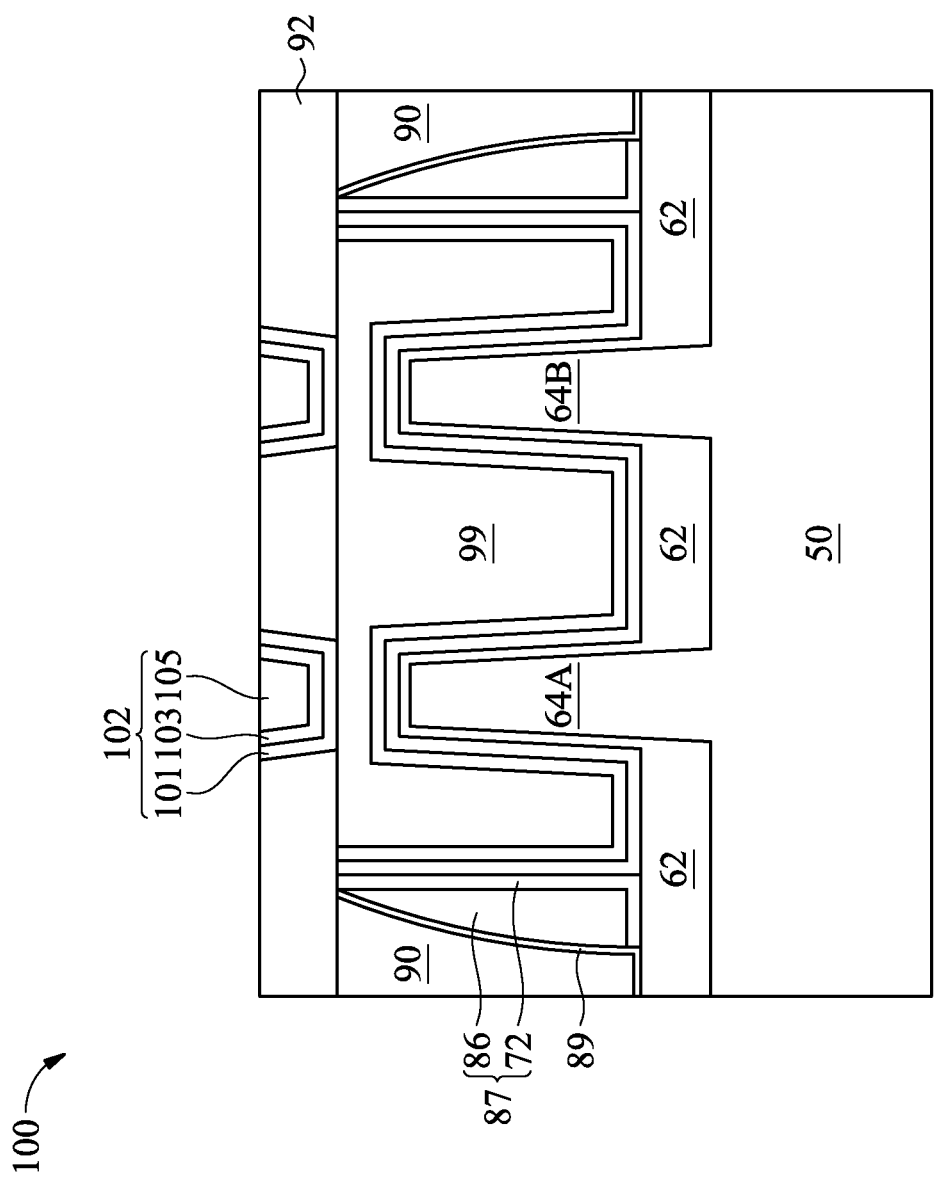

Next, in FIG. 17A, contacts 102 (e.g., 102A, 102B, may also be referred to as contact plugs) are formed in the contact openings 91. Each of the contacts 102 includes a barrier layer 101, a seed layer 103, and a conductive material 105, and is electrically coupled to the underlying conductive feature (e.g., replacement gate structure 97, or silicide region 95), in the illustrated embodiment. The contacts 102A that are electrically coupled to the replacement gate structure 97 may be referred to as gate contacts, and the contacts 102B that are electrically coupled to the silicide regions 95 may be referred to as source/drain contacts. The materials and the formation methods for the barrier layers 101, the seed layer 103 and the conductive material 105 may be the same as or similar to those discussed above for the barrier layers 96, the seed layer 98, and the gate electrode 99 of the replacement gate structure 97, respectively, thus details are not repeated. In FIG. 17A, all of the contacts 102 are illustrated in a same cross-section for illustration purpose. This is, of course, is an example and not limiting. The contacts 102 may be formed in different cross-sections.

FIG. 17B illustrates the FinFET device 100 of FIG. 17A, but along cross-section B-B. FIG. 17B illustrates a contact 102 over each of the fins 64A and 64B. The contacts 102 are electrically coupled to the replacement gate structure 97. The number and the locations of the contacts 102 are for illustration purpose only and not limiting, other numbers and other locations are also possible and are fully intended to be included within the scope of the present disclosure.

Figure 18A:
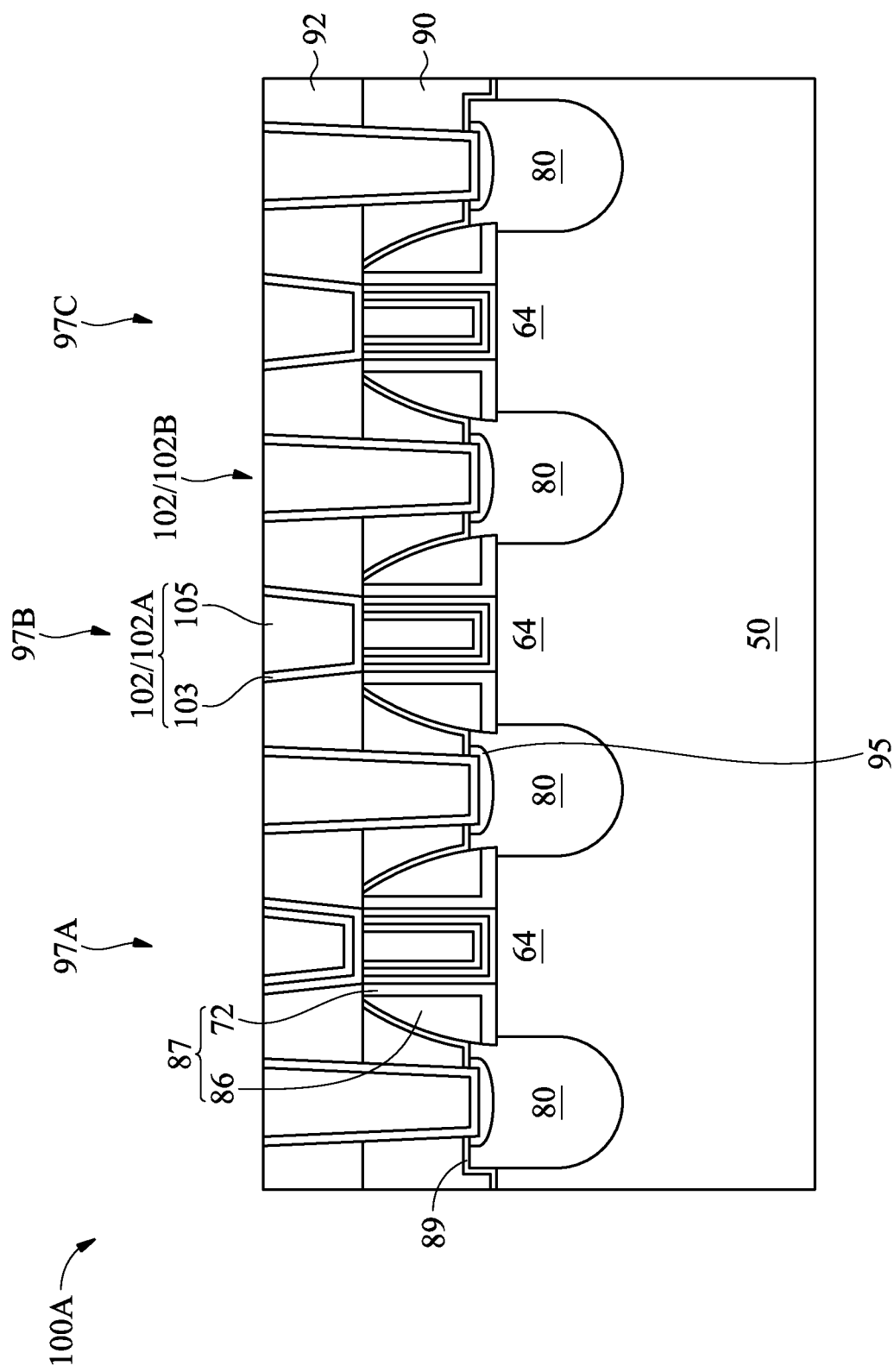
FIGS. 18A and 18B illustrate cross-sectional views of a FinFET device, in accordance with an embodiment.
Figure 18B:
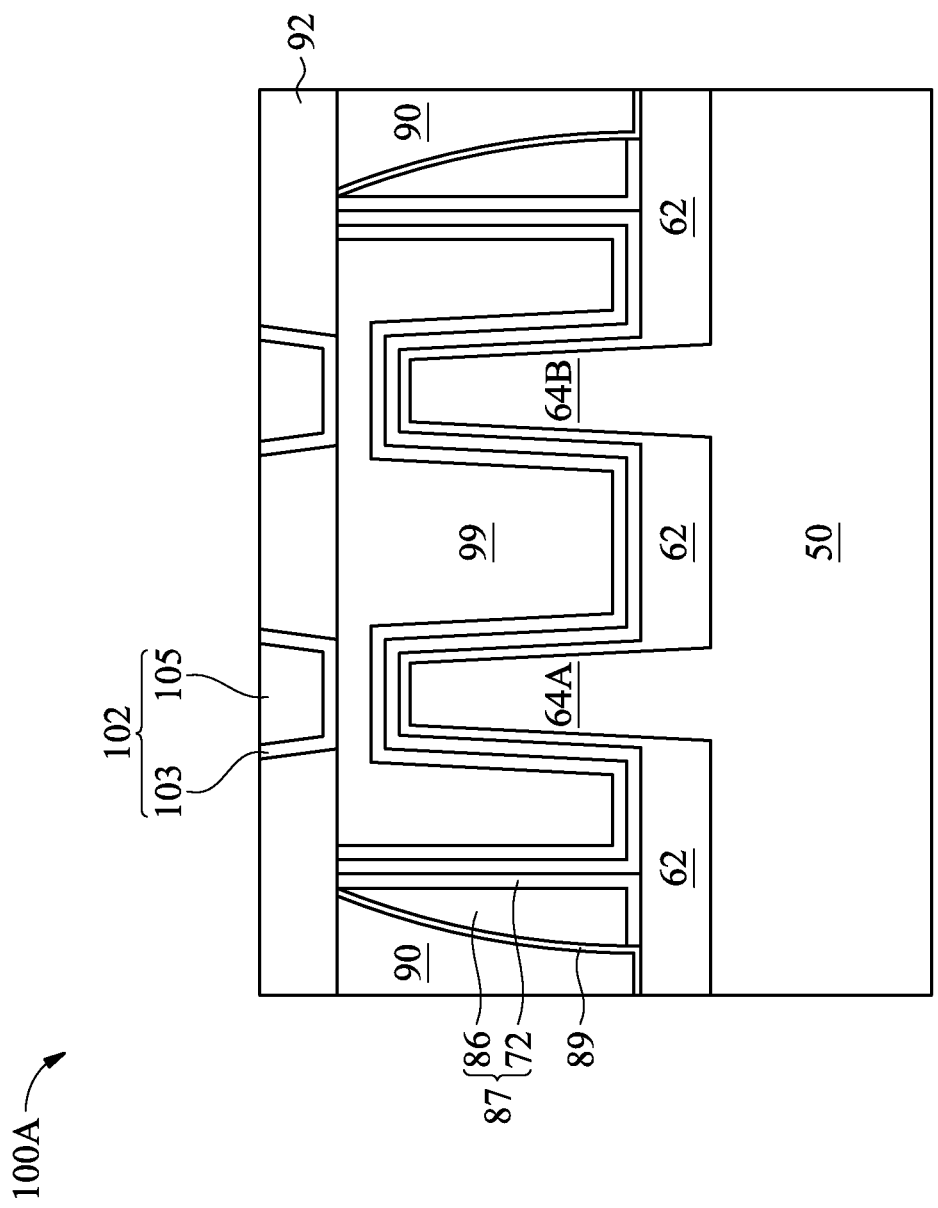

FIGS. 18A and 18B illustrate cross-sectional views of a FinFET device 100A, in accordance with an embodiment. The FinFET device 100A is similar to the FinFET device 100, with same reference number referring to the same or similar component formed by a same or similar formation process, thus details are not repeated. Compared with the FinFET device 100, the FinFET device 100A does not have the barrier layer 101 in the contacts 102, in which case the conductive material 105 may be a metal that does not need a barrier layer to prevent, e.g., copper poisoning, such as cobalt, tungsten, or the like. In other words, the seed layer 103 is formed directly on (e.g., in physical contact with) sidewalls of the first ILD 90 and the second ILD 92.

Variations to the disclosed embodiments are possible and are fully intended to be included within the scope of the present disclosure. For example, while the selectively deposition of the layer 95 is discussed using the example of selectively depositing TiSi over source/drain regions 80, the principle disclosed herein may be used for selective deposition of a layer, such as to deposit the layer on a first material but not on a second material. If a first activation energy needed to allow the layer to form on the first material is smaller than a second activation energy needed to allow the layer to form on the second material, the energy provided by the deposition process (e.g., a PECVD process) may be controlled to be above the first activation energy but smaller than the second activation energy, thereby achieving the selective deposition on the first material. To control the energy provided by the deposition process (e.g., a PECVD process), the RF source of the PECVD process may be turned on and off periodically, as described above with reference to FIGS. 13A-13C, and the ON-time and the OFF-time of each cycle of the RF source may be tuned to achieve the target energy level.

Figure 19:
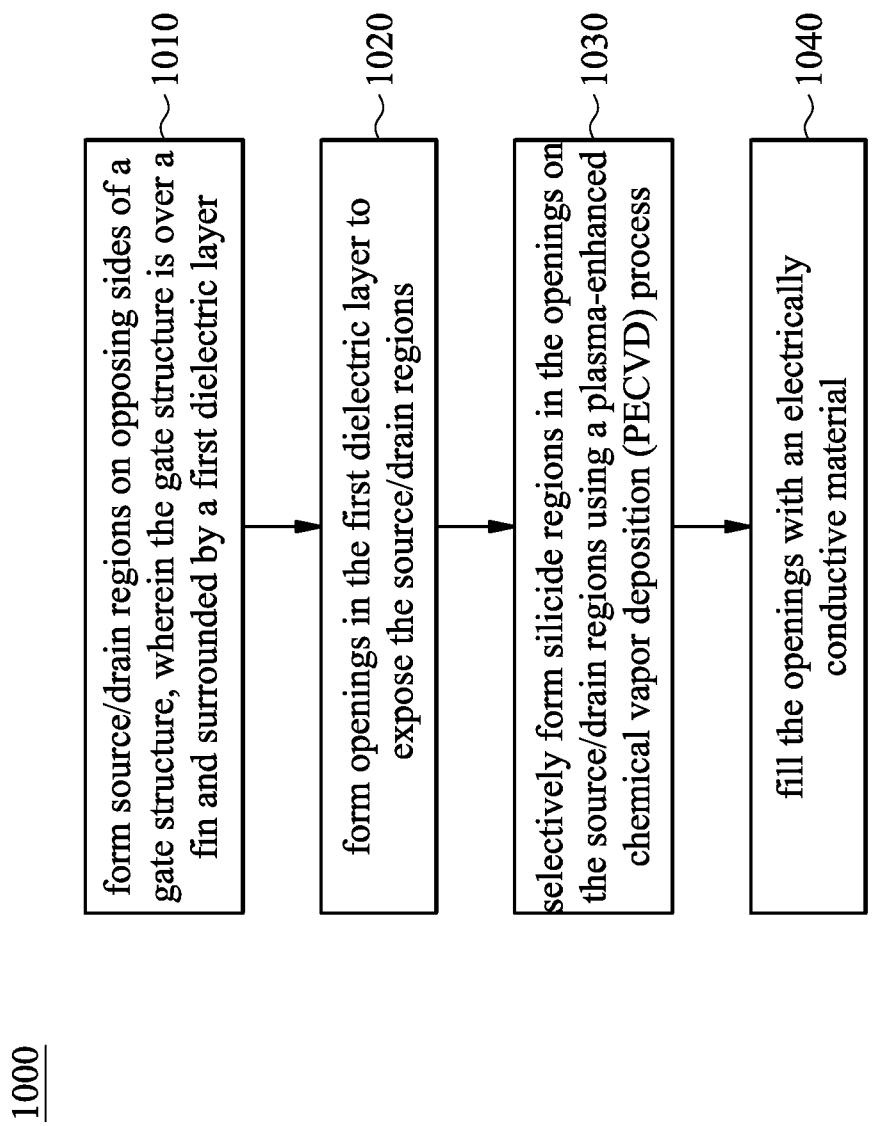
FIG. 19 illustrates a flow chart of method of forming a semiconductor device, in accordance with some embodiments.

FIG. 19 illustrates a flow chart of a method 1000 of forming a semiconductor device, in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at step 1010, source/drain regions are formed on opposing sides of a gate structure, wherein the gate structure is over a fin and surrounded by a first dielectric layer. At step 1020, openings are formed in the first dielectric layer to expose the source/drain regions. At step 1030, silicide regions are selectively form in the openings on the source/drain regions using a plasma-enhanced chemical vapor deposition (PECVD) process. At step 1040, the openings are filled with an electrically conductive material.

In an embodiment, a method of forming a semiconductor device includes forming source/drain regions on opposing sides of a gate structure, wherein the gate structure is over a fin and surrounded by a first dielectric layer; forming openings in the first dielectric layer to expose the source/ drain regions; selectively forming silicide regions in the openings on the source/drain regions using a plasma-enhanced chemical vapor deposition (PECVD) process; and filling the openings with an electrically conductive material. In an embodiment, the method further includes before filling the openings, forming a barrier layer in the openings, wherein the barrier layer lines sidewalls of the first dielectric layer exposed by the openings and lines top surfaces of the silicide regions. In an embodiment, the PECVD process uses an RF source for generating plasmas, wherein the RF source is turned on and off alternately during the PECVD process. In an embodiment, an average energy of the plasmas in the PECVD process is above a first activation energy for forming the silicide regions on the source/drain regions and below a second activation energy for forming the silicide regions on the first dielectric layer. In an embodiment, the RF source is turned on for a first duration and turned off for a second duration in each cycle of the PECVD process, wherein the method further comprises adjusting the average energy of the plasmas by adjusting the first duration and the second duration. In an embodiment, the silicide regions comprise titanium silicide, and the PECVD process is performed using a gas source comprising hydrogen and titanium tetrachloride. In an embodiment, a ratio between a flow rate of hydrogen and a flow rate of titanium tetrachloride is smaller than about 2. In an embodiment, a power of the RF source is between about 100 W and about 500 W. In an embodiment, a frequency of the RF source is between about 1 KHz and about 10 KHz, and a pressure of the PECVD process is between about 1 torr and about 10 torr. In an embodiment, the method further includes before filling the openings, forming a self-aligned barrier layer over the silicide regions. In an embodiment, forming the self-aligned barrier layer comprises supplying a gas that comprises nitrogen or supplying a plasma that comprises nitrogen to surfaces of the silicide regions. In an embodiment, forming the self-aligned barrier layer comprises supplying a gas that comprises oxygen or supplying a plasma that comprises oxygen to surfaces of the silicide regions.

In an embodiment, a method of forming a semiconductor device includes determine a first activation energy for forming a third material on a first material of a semiconductor structure; determine a second activation energy for forming the third material on a second material of the semiconductor structure, the second activation energy being higher than the first activation energy; and selectively depositing the third material on the first material by performing a plasma-enhanced chemical vapor deposition (PECVD) process, where an average energy of plasmas of the PECVD process is above the first activation energy and smaller than the second activation energy. In an embodiment, after selectively depositing the third material, the first material is covered by the third material, and the second material is exposed by the third material. In an embodiment, the plasmas of the PECVD process are generated using an RF source, wherein the RF source is turned on and off alternately during the PECVD process. In an embodiment, the method further comprising adjusting the average energy of the plasmas of the PECVD process by adjusting a first duration during which the RF source is turned on and adjusting a second duration during which the RF source is turned off.

In an embodiment, a method of forming a semiconductor device includes forming a dummy gate structure over a fin, the dummy gate structure being surrounded by a first dielectric layer, the first dielectric layer covering source/drain regions disposed on opposing sides of the dummy gate structure; replacing the dummy gate structure with a metal gate structure; forming openings in the first dielectric layer to expose the source/drain regions; selectively forming a silicide material at bottoms of the openings on the source/drain regions by performing a plasma-enhanced chemical vapor deposition (PECVD) process, wherein an RF source for the PECVD process is turned on and off periodically during the PECVD process; and filling the openings with a conductive material. In an embodiment, the method further comprises adjusting an average energy of plasmas of the PECVD process by adjusting an ON-time and an OFF-time in a cycle of the PECVD process, wherein the ON-time is a first duration of the cycle of the PECVD process during which the RF source is turned on, and the OFF-time is a second duration of the cycle of the PECVD process during which the RF source is turned off. In an embodiment, the silicide material is titanium silicide, and the PECVD process is performed using a gas comprising hydrogen and titanium tetrachloride, wherein a ratio between a flow rate of hydrogen and a flow rate of titanium tetrachloride is smaller than about 2. In an embodiment, the method further comprises before filling the openings, forming a self-aligned barrier layer over the silicide material by supplying a nitrogen-containing gas or a nitrogen-containing plasma to the silicide material.

Embodiments may achieve advantages. For example, the disclosed method allows selective deposition of a metal layer over source/drain regions 80 in preparation for forming silicide regions. Since the metal layer are selectively deposited over the source/drain regions 80 at the bottom of the openings (e.g., source/drain contact openings), the aspect ratio of the openings are not reduced, which reduces or avoids the possibility that voids are formed in the contact plugs. The disclosed method also obviate an etching process used to remove unreacted metal layer after forming the silicide regions, which avoids issues such as oxidization of the silicide regions and consumption of the silicide regions. As a result, the electrical performance of the device formed is improved. In addition, by adjusting the ON-time and the OFF-time of the cycle of the RF source of the PECVD tool, the average energy of the plasmas of the PECVD process may be adjusted easily to be at a target energy level, which may facilitates the selective deposition process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming source/drain regions on opposing sides of a gate structure, wherein the gate structure is over a fin and surrounded by a first dielectric layer;
    forming openings in the first dielectric layer to expose the source/drain regions;
    selectively forming silicide regions in the openings on the source/drain regions by performing a plasma-enhanced chemical vapor deposition (PECVD) process, wherein the PECVD process uses an RF source for generating plasmas, wherein performing the PECVD process comprises tuning an average energy of the plasmas in the PECVD process to be above a first activation energy for forming the silicide regions on the source/drain regions and below a second activation energy for forming the silicide regions on the first dielectric layer, wherein the PECVD process forms the silicide regions at bottoms of the openings on the source/drain regions but does not form a material along sidewalls of the openings; and
    filling the openings with an electrically conductive material.

2. The method of claim 1, further comprising before filling the openings, forming a barrier layer in the openings, wherein the barrier layer lines sidewalls of the first dielectric layer exposed by the openings and lines top surfaces of the silicide regions.

3. The method of claim 2, further comprising before forming the barrier layer, converting an upper portion of the silicide regions into a self-aligned barrier layer, wherein the barrier layer physically contacts the self-aligned barrier layer.

4. The method of claim 3, wherein converting the upper portion of the silicide regions comprises converting the upper portion of the silicide regions into a nitride or an oxide of the silicide regions.

5. The method of claim 1, wherein the RF source is turned on and off alternately during the PECVD process, wherein the RF source is turned on for a first duration and turned off for a second duration in each cycle of the PECVD process, wherein tuning the average energy of the plasmas comprises adjusting the first duration and the second duration.

6. The method of claim 1, wherein the silicide regions comprise titanium silicide, and the PECVD process is performed using a gas source comprising hydrogen and titanium tetrachloride.

7. The method of claim 6, wherein a ratio between a flow rate of hydrogen and a flow rate of titanium tetrachloride is smaller than about 2.

8. The method of claim $_7$, wherein a power of the RF source is between about 100 W and about 500 W.

9. The method of claim 8, wherein a frequency of the RF source is between about 1 KHz and about 10 KHz, and a pressure of the PECVD process is between about 1 torr and about 10 torr.

10. The method of claim 1, wherein filling the openings is performed after selectively forming the silicide regions without an intervening etching process for cleaning the openings.

11. A method of forming a semiconductor device, the method comprising:
    determine a first activation energy for forming a third material on a first material of a semiconductor structure;
    determine a second activation energy for forming the third material on a second material of the semiconductor structure, the second activation energy being higher than the first activation energy; and
    selectively depositing the third material on the first material by performing a plasma-enhanced chemical vapor deposition (PECVD) process, wherein an average energy of plasmas of the PECVD process is above the first activation energy and smaller than the second activation energy, wherein the PECVD process forms the third material on the first material but not on the second material.

12. The method of claim 11, wherein the plasmas of the PECVD process are generated using an RF source, wherein the RF source is turned on and off alternately during the PECVD process.

13. The method of claim 12, further comprising adjusting the average energy of the plasmas of the PECVD process by adjusting a first duration during which the RF source is turned on and adjusting a second duration during which the RF source is turned off.

14. The method of claim 11, wherein the first activation energy corresponds to a first dissociation energy for breaking first bonds between first atoms of the first material, and the second activation energy corresponds to a second dissociation energy for breaking second bonds between second atoms of the second material.

15. A method of forming a semiconductor device, the method comprising:
    forming a dummy gate structure over a fin, the dummy gate structure being surrounded by a first dielectric layer, the first dielectric layer covering source/drain regions disposed on opposing sides of the dummy gate structure;
    replacing the dummy gate structure with a metal gate structure;
    forming openings in the first dielectric layer to expose the source/drain regions;
    selectively forming a silicide material at bottoms of the openings on the source/drain regions by performing a plasma-enhanced chemical vapor deposition (PECVD) process, wherein an RF source for the PECVD process is turned on and off periodically during the PECVD process, wherein the PECVD process covers the source/drain regions with the silicide material but exposes the first dielectric layer;
    converting an upper portion of the silicide material into a self-aligned barrier layer by supplying a nitrogen-containing gas or a nitrogen-containing plasma to the silicide material, wherein sidewalls of the openings are free of the self-aligned barrier layer; and
    filling the openings with a conductive material.

16. The method of claim 15, further comprising adjusting an average energy of plasmas of the PECVD process by adjusting an ON-time and an OFF-time in a cycle of the PECVD process, wherein the ON-time is a first duration of the cycle of the PECVD process during which the RF source is turned on, and the OFF-time is a second duration of the cycle of the PECVD process during which the RF source is turned off.

17. The method of claim 16, wherein the ON-time and the OFF-time are adjusted to tune the average energy of the plasmas to be above a first activation energy for forming the silicide material on the source/drain regions and below a second activation energy for forming the silicide material on the first dielectric layer.

18. The method of claim 15, wherein the silicide material is titanium silicide, and the PECVD process is performed using a gas comprising hydrogen and titanium tetrachloride, wherein a ratio between a flow rate of hydrogen and a flow rate of titanium tetrachloride is smaller than about 2.

19. The method of claim 15, wherein a width of the silicide material is wider than a width of the openings measured at the bottoms of the openings such that the silicide material extends directly under the first dielectric layer between the first dielectric layer and the source/drain regions.

20. The method of claim 15, further comprising, after the converting and before filling the openings, forming a barrier layer in the openings, wherein the barrier layer extends along, and contacts, sidewalls of the first dielectric layer exposed by the openings and the self-aligned barrier layer.

* * * * *